United States Patent
Kim et al.

(10) Patent No.: US 10,991,414 B2
(45) Date of Patent: Apr. 27, 2021

(54) GRANULAR REFRESH RATE CONTROL FOR MEMORY DEVICES BASED ON BIT POSITION

(71) Applicant: Western Digital Technologies, Inc., San Jose, CA (US)

(72) Inventors: Yongjune Kim, San Jose, CA (US); Won Ho Choi, Santa Clara, CA (US); Cyril Guyot, San Jose, CA (US); Yuval Cassuto, Haifa (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/586,903

(22) Filed: Sep. 27, 2019

(65) Prior Publication Data

US 2020/0327928 A1 Oct. 15, 2020

Related U.S. Application Data

(60) Provisional application No. 62/833,149, filed on Apr. 12, 2019.

(51) Int. Cl.
*G11C 11/406* (2006.01)
*G11C 7/10* (2006.01)
(Continued)

(52) U.S. Cl.
CPC ........ *G11C 11/40611* (2013.01); *G06F 12/06* (2013.01); *G11C 7/1045* (2013.01);
(Continued)

(58) Field of Classification Search
CPC ............ G11C 11/40611; G11C 11/409; G11C 11/40607; G11C 2211/4065
See application file for complete search history.

(56) References Cited

U.S. PATENT DOCUMENTS 6,370,613 B1 * 4/2002 Diede .................... G11C 15/04
711/100
7,539,914 B1 5/2009 Sundararajan et al.
(Continued)

OTHER PUBLICATIONS

International Search Report & The Written Opinion of the International Searching Authority dated Mar. 25, 2020, International Application No. PCT/US2019/066657.

*Primary Examiner* — Sultana Begum
(74) *Attorney, Agent, or Firm* — Vierra Magen Marcus LLP

(57) ABSTRACT

A system and method for refreshing memory cells of a memory device includes storing each bit of a B-bit word in a different sub-array of a memory device. Each of the bits is associated with a bit position, and the memory device includes a plurality of sub-arrays. The system and method also include determining a refresh interval for a plurality of the bit positions based upon a relative importance of the plurality of the bit positions to a performance of a machine learning or signal processing task involving the B-bit word. The refresh interval is based upon a fidelity metric and a resource metric. The system and method further include refreshing the plurality of sub-arrays based upon the refresh interval determined for the plurality of bit positions, and dynamically updating the refresh interval for the plurality of bit positions upon receiving a new fidelity metric or a new resource metric.

21 Claims, 13 Drawing Sheets

(51) Int. Cl.
*G11C 11/409* (2006.01)
*G11C 11/402* (2006.01)
*G06F 12/06* (2006.01)

(52) U.S. Cl.
CPC .......... *G11C 11/402* (2013.01); *G11C 11/409* (2013.01); *G11C 11/40607* (2013.01); G11C 2211/4065 (2013.01)

(56) References Cited

U.S. PATENT DOCUMENTS

| | | | | |
|---|---|---|---|---|
| 2011/0302445 | A1* | 12/2011 | Byom | G11C 29/883 714/6.1 |
| 2012/0300568 | A1* | 11/2012 | Park | G11C 11/40622 365/222 |
| 2016/0232951 | A1* | 8/2016 | Shanbhag | G11C 7/16 |

\* cited by examiner

US 10,991,414 B2

GRANULAR REFRESH RATE CONTROL FOR MEMORY DEVICES BASED ON BIT POSITION

CROSS-REFERENCE TO RELATED APPLICATION

This application claims priority from U.S. provisional application No. 62/833,149, filed on Apr. 12, 2019, the entirety of which is incorporated by reference herein.

BACKGROUND

Applicant provides the following description to assist the understanding of the reader. None of the information provided or references cited is admitted to be prior art.

Memory devices are used in a wide variety of applications for storing data. Depending upon the type of the memory device, data that is stored in those memory modules may need to be periodically refreshed to prevent data loss. However, present day mechanisms to refresh memory devices have limitations due to their configuration and the way they operate.

SUMMARY

The systems, methods, and devices of this disclosure each have several innovative aspects, no single one of which is solely responsible for the all of the desirable attributes disclosed herein.

Various aspects of the disclosure will now be described with regard to certain examples and embodiments, which are intended to illustrate but not limit the disclosure. Although the examples and embodiments described herein will focus on, for the purpose of illustration, specific systems and processes, one of skill in the art will appreciate the examples are illustrative only, and are not intended to be limiting.

In accordance with some aspects of the present disclosure, a method is disclosed. The method includes storing each bit of a B-bit word in a different sub-array of a memory device. Each of the bits is associated with a bit position, and the memory device includes a plurality of sub-arrays. The method also includes determining a refresh interval for a plurality of the bit positions based upon a relative importance of the plurality of the bit positions to a performance of a machine learning or signal processing task involving the B-bit word. The refresh interval is based upon a fidelity metric and a resource metric. The method further includes refreshing the plurality of sub-arrays based upon the refresh interval determined for the plurality of bit positions and dynamically updating the refresh interval for the plurality of bit positions upon receiving a new fidelity metric or a new resource metric.

In accordance with some other aspects of the present disclosure, a system is disclosed. The system includes a memory device having a plurality of sub-arrays, such that each of the plurality of sub-arrays stores one bit of a B-bit word. The system also includes a memory controller in operational association with each of the plurality of sub-arrays. The memory controller includes programmed instructions to store one bit of a B-bit word in each of the plurality of sub-arrays, and determine a first refresh interval for a most significant bit of the B-bit word and a second refresh interval for a least significant bit of the B-bit word. The first refresh interval is less than the second refresh interval, and the first refresh interval and the second refresh interval are determined to either minimize a fidelity metric or minimize a resource metric. The memory controller also includes programmed instructions to refresh a first sub-array of the plurality of sub-arrays storing the most significant bit based on the first refresh interval and refresh a second sub-array of the plurality of sub-arrays storing the least significant bit based on the second refresh interval.

In accordance with yet other aspects of the present disclosure, a non-transitory computer-readable medium having computer-readable instructions stored thereon is disclosed. The instructions when executed by a processor associated with a dynamic random access memory module cause the processor to receive a fidelity metric, receive a resource metric, receive a granularity, and determine a refresh interval for a plurality of bit positions of a B-bit word to satisfy the granularity and the resource metric while minimizing the fidelity metric. The refresh interval for a more important bit position to a performance of a machine learning or signal processing task involving the B-bit word is less than the refresh interval for a lesser important bit position. The instructions also cause the processor to dynamically update the refresh interval of the plurality of bit positions upon receiving a new fidelity metric, a new resource metric, or a new granularity.

The foregoing summary is illustrative only and is not intended to be in any way limiting. In addition to the illustrative aspects, embodiments, and features described above, further aspects, embodiments, and features will become apparent by reference to the following drawings and the detailed description.

Figure 1:
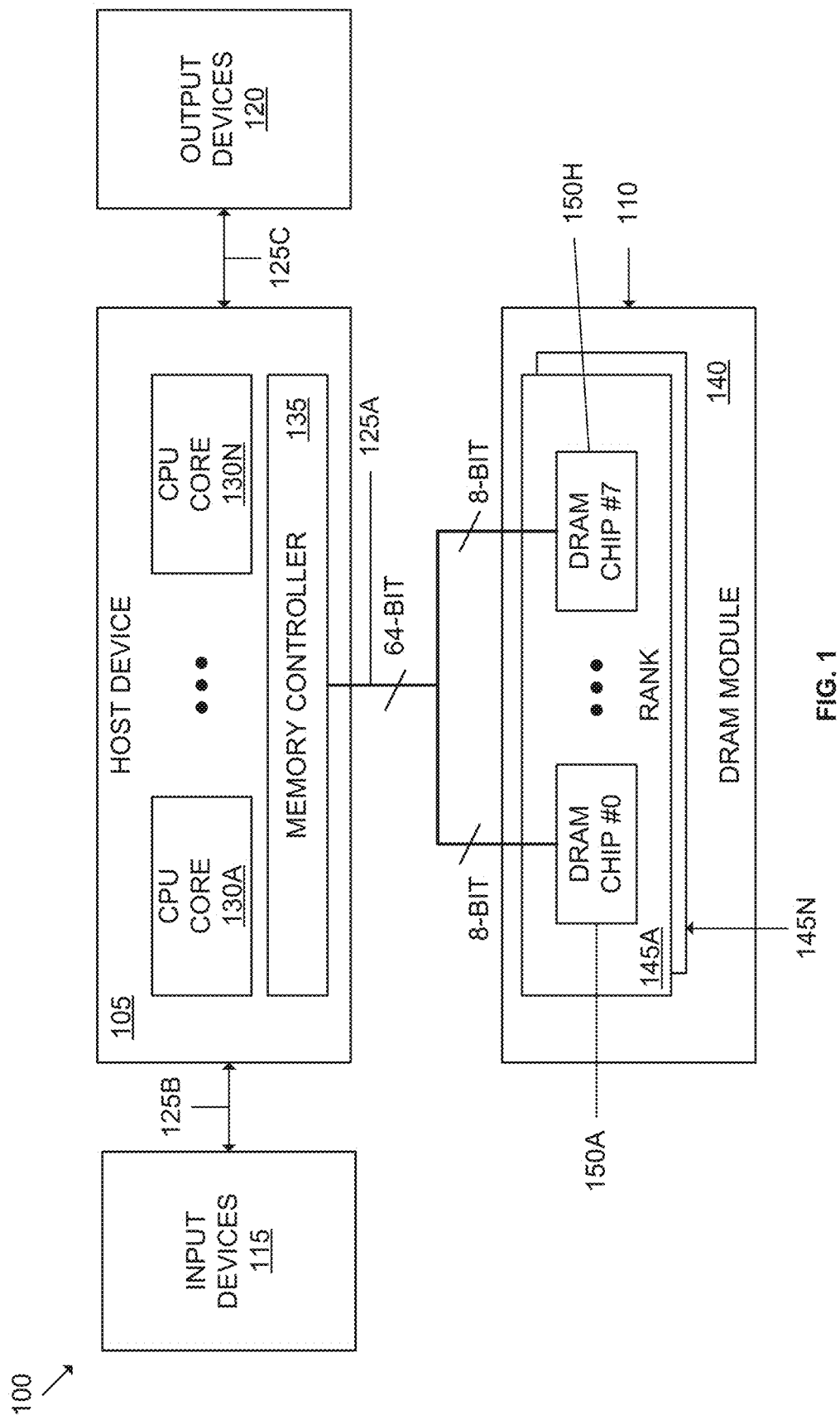
FIG. 1 is an example block diagram of a computing system, in accordance with some embodiments of the present disclosure.

The foregoing and other features of the present disclosure will become apparent from the following description and appended claims, taken in conjunction with the accompanying drawings. Understanding that these drawings depict only several embodiments in accordance with the disclosure and are therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

Memory refresh (also referred to herein as refresh, refreshing, refresh operation, or the like) is a periodically repeated procedure that reads and rewrites the data of a memory cell to prevent loss of data that is stored within that memory cell. Dynamic Random-Access Memory ("DRAM") memory cells store data in the form of charge in a capacitor. DRAM memory cells cannot retain their data permanently because of the gradual loss of charge from the capacitor over time. Thus, the capacitor of a DRAM memory cell needs to be refreshed periodically to recharge the capacitor. The time a DRAM memory cell is able to retain the data stored therein is called the "retention time" of the DRAM memory cell. The time interval between two refresh cycles of the DRAM memory cell is called the "refresh interval." The refresh interval is inverse of the refresh rate. In other words, the greater the refresh interval, the smaller is the refresh rate. In yet other words, a DRAM memory cell that is less frequently refreshed (thereby having a greater refresh interval) is more susceptible to loss of data stored in that DRAM cell than a DRAM memory cell that is more frequently refreshed. A DRAM memory cell that cannot retain charge for the refresh interval results in a failure, referred to as "retention failure" or "retention error." An example refresh interval that is used in existing DRAM memory standards is sixty four milliseconds.

While refresh operations are important to prevent loss of data in DRAM memory cells, frequent refresh operations consume considerable amount of power and degrade system performance. The power consumed during a refresh operation is referred to herein as "refresh power." As the capacity of a DRAM memory device increases and as the size of a DRAM memory cell shrinks, the capacitors of DRAM memory cells become more susceptible to charge leakage and require more frequent refresh operations. More frequent refresh operations in turn increase refresh power consumption even more. Refresh power consumption is critical in battery-powered/mobile computing applications, particularly because refresh operations are still required during idle periods, unlike write and read operations. Studies have shown that as the capacity of the DRAM memory device increases, the refresh power consumption becomes a greater part of the overall power consumption of the DRAM memory device. For example, studies have shown that the refresh power consumption in a four gigabyte DRAM memory device may account for about fifteen percent of the total power consumption of the DRAM memory device, and in a sixty four gigabyte DRAM memory device, the refresh power may account for about forty seven percent of the total power consumption of the DRAM memory device.

One mechanism to reduce refresh power consumption is to reduce the refresh rate (or increase the refresh interval) of a DRAM memory cell. However, reducing the refresh rate increases the likelihood of retention failure. To counteract retention failure, some techniques use error correction coding schemes to correct any resulting retention failures. These error correcting schemes, however, suffer from storage or bandwidth overheads, and are not desirable. Some other techniques empirically compute an ideal refresh rate for the DRAM memory device and fix the refresh intervals to the empirically computed refresh rate. With such techniques, once the refresh rate is fixed, the refresh interval cannot be changed even though the refresh interval may not be optimal for each DRAM cell.

The present disclosure provides technical solutions for dynamically varying and optimizing refresh intervals by achieving desired fidelity and resource metrics. In many signal processing and machine learning operations, the impact of bit errors depends on a bit position of a bit in a B-bit word. For example, in some embodiments, errors in the Most Significant Bit ("MSB") position(s) of a B-bit word may degrade the overall impact of data on the performance of the signal processing and machine learning operations much more than errors in the Least Significant Bit ("LSB") position(s). Such relative or differentiated impact of errors in the MSB and LSB position(s) may be found in, for example, image and video applications, and such applications may better tolerate errors in the LSB position(s) while maintaining an acceptable level of performance. Similarly, in other embodiments, other bit positions may be more important than the MSB and LSB. Thus, the present disclosure provides mechanisms for determining refresh intervals based on the relative important of a bit position. Further, the present disclosure provides mechanisms to determine the refresh intervals based on minimizing a fidelity metric, such as a Mean Squared Error ("MSE"), a Peak Signal-to-Noise Ratio ("PSNR"), Bit Error Rate ("BER"), etc. or minimizing a resource metric, such as the refresh power.

In some embodiments, a refresh interval control system may apply convex programming and/or machine learning to derive the refresh intervals that are based on the relative importance of the bit positions and satisfy the fidelity metric and/or the resource metric. For example, in some embodiments, the refresh interval control system may use Karush-Kuhn-Tucker (KKT) conditions to determine the refresh intervals. The refresh intervals determined by such convex programming are considered optimal refresh intervals. Advantageously, the optimal refresh intervals determined by the refresh interval control system include shorter refresh intervals for more important bit positions than for less important bit positions. For example, in some embodiments, the optimal refresh interval of the MSB may be shorter than the optimal refresh interval for the LSB. Thus, non-uniform refresh intervals that are optimal for a bit position may be computed and used to reduce refresh power consumption, reduce MSE, and improve PSNR, compared to uniform refresh intervals.

Referring now to FIG. 1, an example block diagram of a computing system 100 is shown, in accordance with some embodiments of the disclosure. The computing system 100 includes a host device 105 associated with a memory device 110. The host device 105 may be configured to receive input from one or more input devices 115 and provide output to one or more output devices 120. The host device 105 may be configured to communicate with the memory device 110, the input devices 115, and the output devices 120 via appropriate interfaces or channels 125A, 125B, and 125C, respectively. The computing system 100 may be implemented in a variety of computing devices such as computers (e.g., desktop, laptop, etc.), tablets, personal digital assistants, mobile devices, wearable computing devices such as smart watches, other handheld or portable devices, or any other computing unit suitable for performing operations using the host device 105.

The input devices 115 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 105 and that allows an external source, such as a user, to enter information (e.g., data) into the host device and send instructions to the host device. Similarly, the output devices 120 may include a variety of output technologies such as external memories, printers, speakers, displays, microphones, light emitting diodes, headphones, plotters, speech generating devices, video devices, global positioning systems, and any other output peripherals that are configured to receive information (e.g., data) from the host device 105. The "data" that is either input into the host device 105 and/or output from the host device may include any of a variety of textual data, graphical data, video data, sound data, position data, combinations thereof, or other types of analog and/or digital data that is suitable for processing using the computing system 100.

The host device 105 may include one or more Central Processing Unit ("CPU") cores or processors 130A-130N that may be configured to execute instructions for running one or more applications associated with the host device. In some embodiments, the instructions and data needed to run the one or more applications may be stored within the memory device 110. The host device 105 may also be configured to store the results of running the one or more applications within the memory device 110. Thus, the host device 105 may be configured to request the memory device 110 to perform a variety of operations. For example, the host device 105 may request the memory device 110 to read data, write data, update or delete data, and/or perform management or other operations.

To facilitate communication with the memory device 110, the host device 105 may include or be associated with a memory controller 135. Although the memory controller 135 is shown as being part of the host device 105, in some embodiments, the memory controller may instead be part of the memory device 110 or another element of the computing system 100 and operatively associated with the memory device. The memory controller 135 may be configured as a logical block or circuitry that receives instructions from the host device 105 and performs operations in accordance with those instructions. For example, the memory controller 135 may be configured to read data from or write data to the memory device 110 via the interface 125A. Although the interface 125A has been shown in FIG. 1 as being 64-bit wide, in other embodiments, the bandwidth of the interface 125A may vary depending upon the configuration of the memory device 110.

In some embodiments and as shown, the memory device 110 may include a DRAM memory module 140. In other embodiments, the memory device 110 may include other or additional types of memory modules that require regular refreshing, such as synchronous DRAM, Magnetoresistive Random Access Memory (MRAM), Resistive Random Access Memory (ReRAM), etc., to prevent data loss, as well as memory modules that do not require regular refreshing. For ease of description, DRAM will be used in the description here but the scope of the various embodiments encompasses these other memory types including those mentioned above. Further, although the memory device 110 has been shown as having a single DRAM module (e.g., the DRAM memory module 140), in other embodiments, the memory device may be made up of multiple DRAM modules. Each of the DRAM memory module 140 may include a plurality of DRAM chips organized into a plurality of ranks 145A-145N. For example, the rank 145A may include DRAM chips 150A-150H. Although the rank 145A has been shown as having eight DRAM chips (e.g., the DRAM chips 150A-150H), in some embodiments, the number of DRAM chips that form part of the rank 145A may vary to be less than or greater than eight. Further, each of the ranks 145A-145N may have the same or different number of DRAM chips than other ranks.

Thus, each of the ranks 145A-145N represents a group of DRAM chips that operate synchronously to provide a wide data bus. For example, in some embodiments and as shown, each of the DRAM chips 150A-150H may be configured for 8-bit communication, such that together, the eight DRAM chips form a 64-bit wide bandwidth of the interface 125A. In other embodiments, one or more of the DRAM chips 150A-150N may be configured for communication in other bit-widths. By operating synchronously, each of the DRAM chips 150A-150N may simultaneously transfer eight bits of data between the memory controller 135 and the DRAM memory module 140. Further, the interface 125A may be configured for double-data rate or single-data rate communication with the DRAM memory module 140. Therefore, the memory controller 135 may individually and independently control each of the ranks 145A-145N of the DRAM memory module 140 and each of the DRAM chips 150A-150H of each of the ranks.

It is to be understood that only some components of the computing system 100 are shown and described in FIG. 1. However, the computing system 100 may include other components such as various batteries and power sources, networking interfaces, routers, switches, external memory systems, controllers, etc. Generally speaking, the computing system 100 may include any of a variety of hardware, software, and/or firmware components that are needed or considered desirable in performing the functions described herein. Similarly, the host device 105, the input devices 115, the output devices 120, and the memory device 110 including the DRAM memory module 140, may include other hardware, software, and/or firmware components that are considered necessary or desirable in performing the functions described herein. In addition, in certain embodiments, the memory device 110 may integrate some or all of the components of the host device 105, including, for example, the CPU cores 130A-130N, and the CPU cores may implement the refresh optimization determination and related control as described herein.

Figure 2:
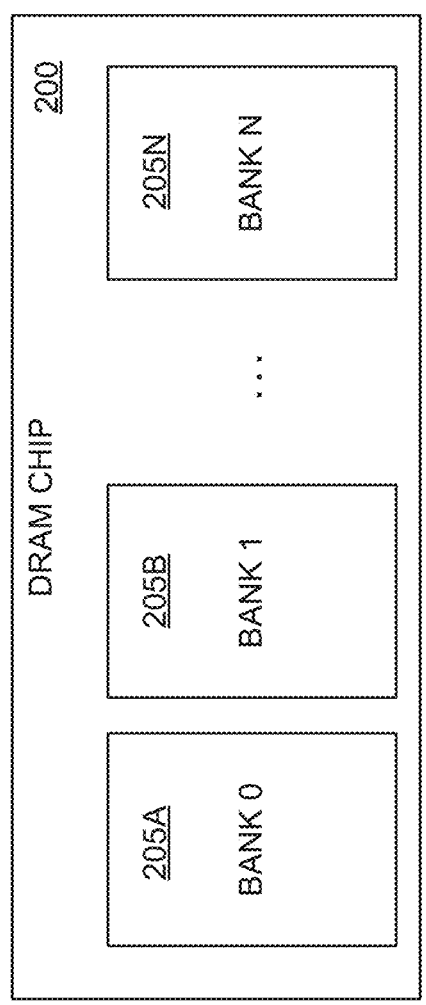
FIG. 2 is an example block diagram of a Dynamic Random Access Memory ("DRAM") memory chip of the computing system of FIG. 1, in accordance with some embodiments of the present disclosure.

Turning now to FIG. 2, additional details of a DRAM chip 200 are shown, in accordance with some embodiments of the present disclosure. The DRAM chip 200 may be one of the plurality of DRAM chips of the DRAM memory module 140 of FIG. 1. For example, the DRAM chip 200 may be one of the DRAM chips 150A-150N. The DRAM chip 200 may include multiple memory banks 205A-205N. For example, in some embodiments, the DRAM chip 200 may include eight memory banks. In other embodiments, the DRAM chip 200 may include sixteen memory banks. In yet other embodiments, the DRAM chip 200 may include another number of memory banks, as desired. Each of the memory banks 205A-205N is configured to process DRAM commands (e.g., read or write data) independently to increase parallelism. Further details of each of the memory banks 205A-205N are shown in FIG. 3 below.

Figure 3:
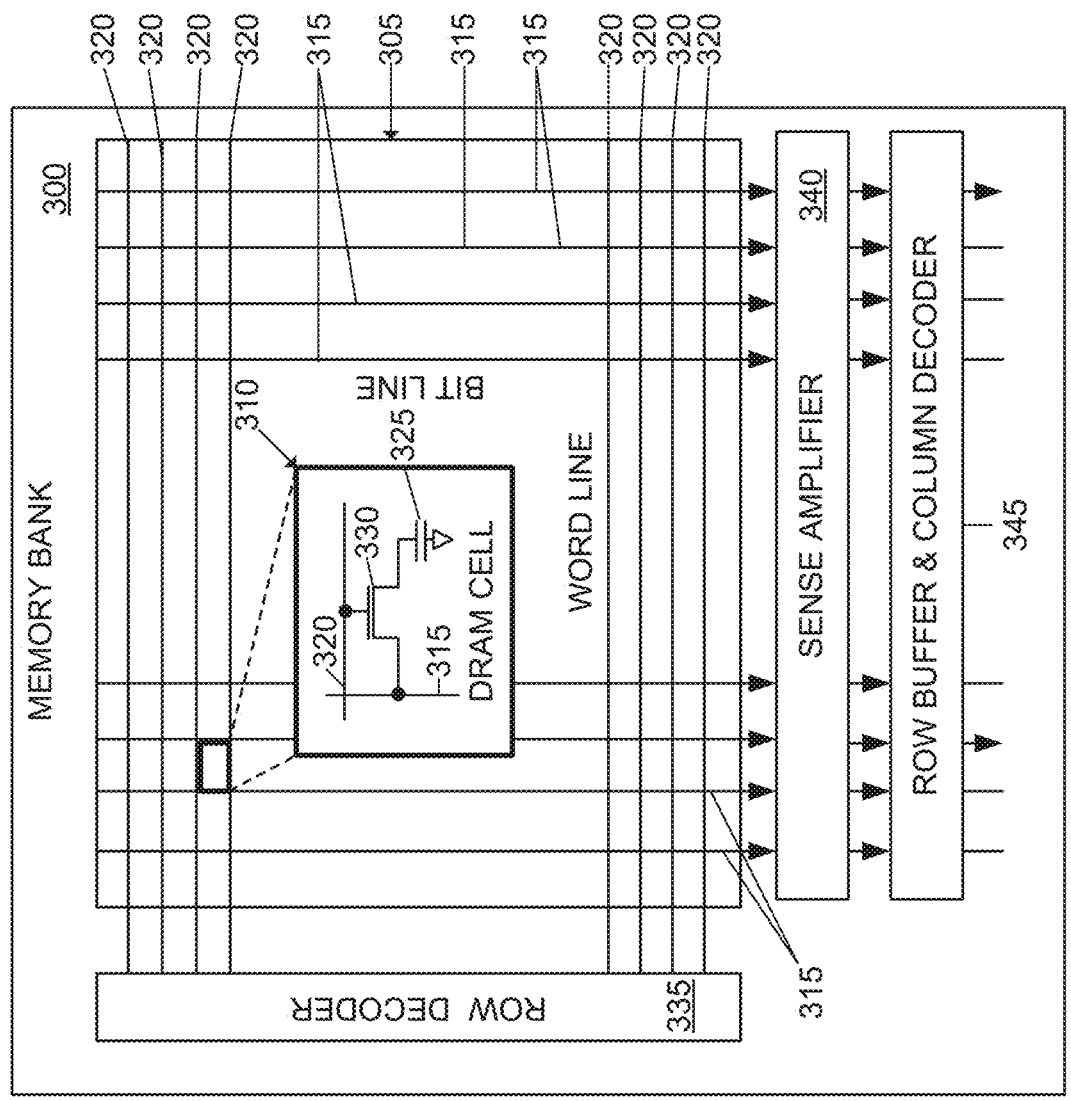
FIG. 3 is an example block diagram showing additional details of the DRAM memory chip of FIG. 2, in accordance with some embodiments of the present disclosure.

Referring now to FIG. 3, an example block diagram of a memory bank 300 of an example DRAM chip is shown, in accordance with some embodiments of the present disclosure. The memory bank 300 may correspond to one of the memory banks 205A-205N of FIG. 2. The memory bank 300 includes a memory array 305 of DRAM memory cells organized into rows and columns. One DRAM memory cell 310 is shown in greater detail. While not specifically marked, a DRAM memory cell is formed at the intersection of a row and a column of the memory array 305. The number of rows and columns in the memory array 305 depend upon the memory capacity that is desired in the memory bank 300. Each column of the memory array 305 forms a bit line 315 (only some of which are marked in FIG. 3) and each row of the memory array forms a word line 320 (again, only some of which are marked in FIG. 3). The DRAM memory cells (e.g., the DRAM memory cell 310) in each column share a bit line (e.g., one of the bit lines 315) and the DRAM memory cells in each row share a word line (e.g., the word line 320).

The DRAM memory cell 310 includes a capacitor 325 configured to store binary data in the form of electrical charge. In some embodiments, the charged state of the capacitor 325 corresponds to a binary "1" and the discharged state of the capacitor corresponds to a binary "0." The capacitor 325 is connected at one end to an access transistor 330 that serves as a voltage-controlled switch to connect the capacitor 325 to the bit line 315 of the column of which the DRAM memory cell is part of. The access transistor 330 is turned on and off via the control gate of the access transistor being connected to the word line 320 of the row of which the DRAM memory cell 310 is part of Each of the word lines 320 may be selectively enabled or disabled using a row decoder 335. When the row decoder 335 enables a particular one of the word line 320, the enabled word line in turn enables the access transistor 330 of the DRAM memory cell 310 and all other DRAM cells connected to that word line. Further, each of the bit lines 315 is connected to a sense amplifier 340. The sense amplifier 340 detects the charge stored in the capacitor 325 and converts that charge into binary information.

Thus, when the access transistor 330 of the DRAM memory cell 310 and the access transistors of other DRAM memory cells along the selected one of the word line 320 are enabled, those DRAM memory cells are all connected to the sense amplifier 340 via their respective bit lines 315, thereby enabling the sense amplifier to read data by sensing the charge stored in each of the DRAM memory cells. The charge detected by the sense amplifier 340 and converted into binary information may be stored within a row buffer and column decoder 345. The row buffer component of the row buffer and column decoder 345 may latch the information of the DRAM memory cell 310 and the other DRAM memory cells that has been detected and the column decoder component of the row buffer and column decoder may transfer a chunk of the information from the row buffer component for transfer to the memory controller (e.g., the memory controller 135). The row buffer and column decoder 345 may also be used to temporarily store the data that is to be stored within the DRAM memory cell 310 and the other DRAM memory cells of the memory array 305.

Each DRAM memory cell (e.g., the DRAM memory cell 310) is configured to store one bit of data therein. The capacitor 325 of the DRAM memory cell 310 leaks charge over time. To prevent the data that is stored in the capacitor 325 from being lost, the DRAM memory cell 310 is refreshed periodically. Similarly, all other DRAM memory cells are refreshed periodically.

Figure 4:
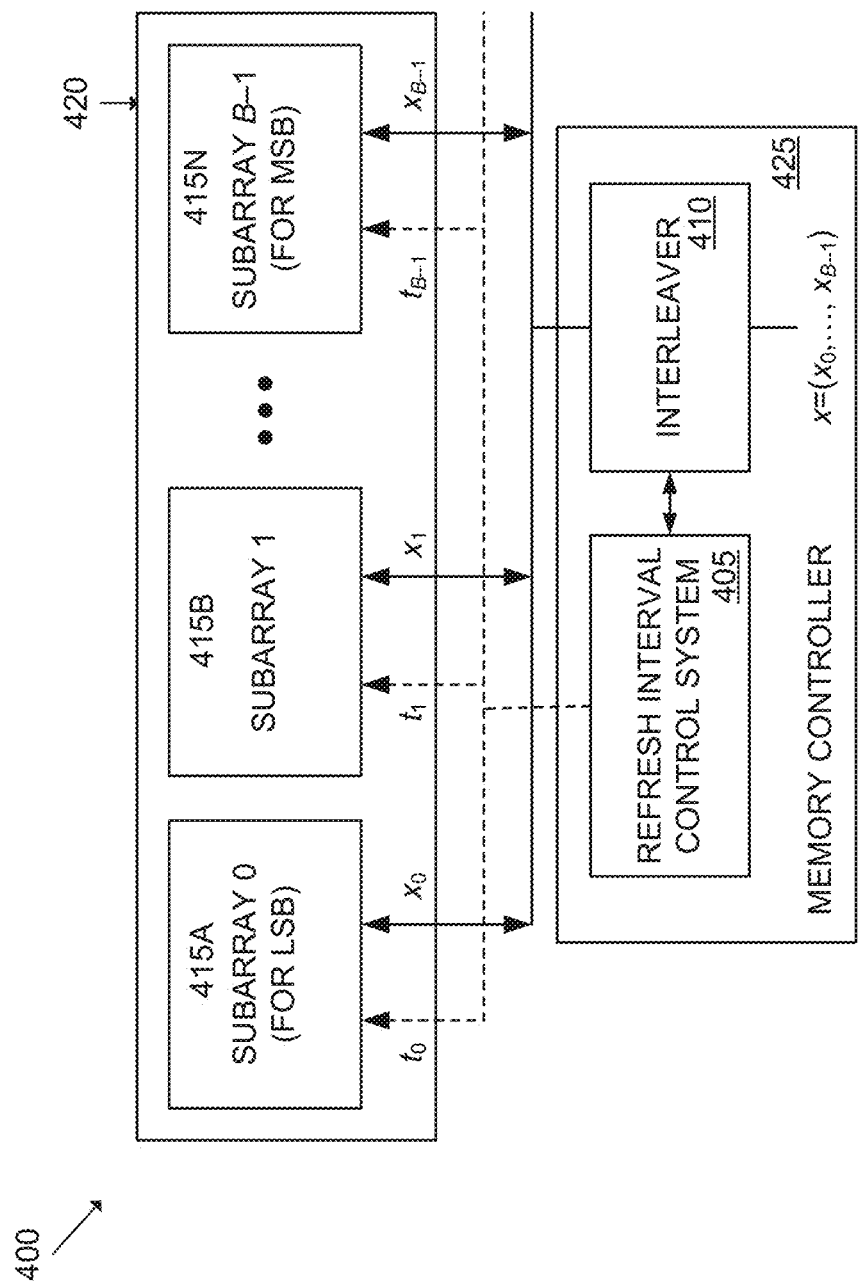
FIG. 4 is an example block diagram of a refresh system of the computing system of FIG. 1 for refreshing data stored in the DRAM memory chip of FIG. 2, in accordance with some embodiments of the present disclosure.

Turning to FIG. 4, an example block diagram of a refresh system 400 is shown, in accordance with some embodiments of the present disclosure. The refresh system 400 is used to refresh DRAM memory cells periodically. The refresh system 400 includes a refresh interval control system 405 to determine an optimal refresh interval for a DRAM memory cell (e.g., the DRAM memory cell 310 of FIG. 3) and an interleaver 410 to store data within one or more sub-arrays 415A-415N of a DRAM module 420. The DRAM module 420 corresponds to the DRAM memory module 140. Therefore, the DRAM module 420 may include one or more DRAM chips organized into one or more ranks, and each DRAM chip may include one or more memory banks, and each memory bank may include a plurality of DRAM memory cells. In some embodiments, each of the sub-arrays 415A-415N may correspond to a memory bank of a DRAM chip on the DRAM module 420. Further, in some embodiments, each of the sub-arrays 415A-415N may belong to the same rank on the DRAM chip, while in other embodiments, at least some of the sub-arrays may be part of different ranks. In other embodiments, each of the sub-arrays 415A-415N may correspond to a separate DRAM chip on the DRAM module. In some embodiments, each of the sub-arrays 415A-415N may be formed for dedicated portions of one memory bank. In yet other embodiments, each of the sub-arrays 415A-415N may be formed from other dedicated portions of the DRAM module 420 depending upon the architecture of the DRAM module.

In some embodiments, each of the sub-arrays 415A-415N is configured for parallel operation. In other words, a memory controller 425 that is associated with the DRAM module 420 may be able to control each of the sub-arrays 415A-415N independently and simultaneously. Additionally, each of the sub-arrays 415A-415N may be of the same size (e.g., same capacity) or of a different size relative to other sub-arrays. Each of the sub-arrays 415A-415N may be configured to store data that is stored within the DRAM module 420. For each piece of data that is stored within the DRAM module 420, each of the sub-arrays 415A-415N is configured to store one bit of the piece of data. For example, for an eight-bit data that is stored within the DRAM module 420, a first sub-array of the sub-arrays 415A-415N may be configured to store a first bit of the eight-bit data, a second sub-array may be configured to store a second bit of the eight-bit data, a third sub-array may be configured to store a third bit of the eight-bit data, and so on.

The number of sub-arrays that form part of the sub-arrays 415A-415N may vary based upon the configuration of the DRAM module 420 and the bandwidth (e.g., bit-width) of each piece of data that the DRAM module stores. In some embodiments, the sub-arrays 415A-415N may include eight sub-arrays to store eight-bit data. In other embodiments, the sub-arrays 415A-415N may include sixteen sub-arrays to store sixteen-bit data. In yet other embodiments, groups of sub-arrays may be formed to store data that is larger than eight-bits in width. For example, in some embodiments, a first group of eight sub-arrays may store the bits 0-7 of the data, while a second group of eight sub-arrays may store bits 8-15 of the data. Thus, depending upon the size of the data that is to be stored and the configuration of the DRAM module 420, the number of sub-arrays may be vary.

Further, each of the sub-arrays 415A-415N may be dedicated to storing a particular bit position of the data. Specifically, each piece of data, regardless of the bit-width, includes a Least Significant Bit ("LSB"), a Most Significant Bit ("MSB"), and bits occupying bit positions between the LSB and the MSB. As used herein, the LSB is the right-most bit of a piece of data and the MSB is the left-most bit of the piece of data. Thus, for example, for an eight bit data, B0B1B2B3B4B5B6B7, B0 is the MSB and B7 is the LSB. Bits B1-B6 occupy bit positions between the MSB and LSB. In some embodiments, the MSB bit, B0, may be said to occupy the first bit position, bit B1 may be said to occupy the second bit position, bit B2 may be said to occupy the third bit position, and so on. The LSB bit, B7, may be said to occupy the eighth bit position.

Each of the sub-arrays 415A-415N may be dedicated to storing a specific bit position of a piece of data. For example and as shown in FIG. 4, the sub-array 415A may be configured to store the LSB (e.g., bit B7 in the example above), the sub-array 415N may be configured to store the MSB (e.g., bit B0 in the example above), while the sub-arrays 415B-415M may be configured to store bit positions between the LSB and MSB (e.g., bits B1-B6 in the example above). By virtue of being dedicated to storing a specific bit position of data, each time a piece of data is to be stored, the LSB of that data may be stored within the sub-array 415A, the MSB of the data may be stored within the sub-array 415N, and each bit between the LSB and MSB may be stored within one sub-array between the sub-array 415A and 415N depending upon the bit position of that bit and the sub-array that is configured to store that bit position.

The interleaver 410 may be configured to know which sub-array of the sub-arrays 415A-415N stores data of which bit position. Thus, the interleaver 410 may be configured to know that the LSB of a piece of data is to be stored within the sub-array 415A, the MSB of the piece of data is to be stored within the sub-array 415N, and so on. For example, for an eight-bit data x=(x0, x1, x2, . . . x7) where bit x0 is the LSB and bit x7 is the MSB, the interleaver 410 may store the bit, x0, in the sub-array 415A, the bit, x1, in the sub-array 415B, the bit, x7, in the sub-array 415N, and so on. As will be discussed further below, the interleaver 410 may be configured to periodically scramble or change which sub-arrays store which bit positions to reduce bit drift and wear on the sub-arrays 415A-415N. By storing each bit of data in a different sub-array, different refresh intervals may be determined for each bit position depending upon the relative importance of that bit position.

Specifically, in many applications such as machine-learning applications and signal processing, the impact of bits errors depends upon the bit position. For example, errors in the MSB position of an image pixel may degrade overall image quality more than errors in the LSB position. An error in the MSB may also impact the inference or characterization accuracy in machine learning applications. Thus, errors in the LSB may be more tolerable than errors in the MSB. In other words, maintaining the accuracy of the MSB may be more important than maintaining the accuracy of the LSB. To maintain the greater accuracy of the MSB compared to the LSB, the MSB may need to be refreshed more frequently than the LSB. In other embodiments, errors in other bit positions other than MSB and LSB may be degrade the data more. By separating and storing each bit of a piece of data in a separate sub-array, the refresh system 400 provides the ability to set different refresh intervals for a plurality of bit positions of the data based upon the relative bit positions of the bits. The refresh interval control system 405 may be configured to determine the refresh interval for a plurality of bit positions depending upon the relative importance of that bit position.

The error in a bit of a piece of data may be defined in terms of a Bit Error Rate ("BER"). Specifically, the BER may be defined as the number of errors in a particular bit per unit time. Lower BER is generally desirable. The BER, p, is a function, g, of the refresh interval, t:

$$p = g(t)$$

A longer refresh interval, t, (e.g., refreshing less frequently) leads to a higher BER. Further, refresh power, Pr, is inversely proportional to the refresh interval, t:

$$Pr \propto 1/t$$

Thus, shorter the refresh interval, t, higher is the refresh power, Pr, consumption. The refresh interval control system 405 is configured to determine an optimal refresh interval, t, for a bit that minimizes or achieves a desired BER, p, and refresh power, Pr, consumption. The BER is referred to herein as a fidelity metric while the refresh power consumption is referred to herein as a resource metric. As discussed below, other fidelity metrics may also be used. For example, a Mean Square Error ("MSE") is another fidelity metric. While BER defines the error rate for a particular bit of a data, the MSE defines the cumulative error rate for all bits of the data combined. Peak Signal to Noise Ratio ("PSNR") is another fidelity metric that may be used to compute the refresh intervals. PSNR represents a measure of the peak error in a piece of data. Other fidelity metrics may be used as desired.

Since $Pr \propto 1/t$, for a B-bit word, the normalized refresh power consumption may be given as:

$$P(t) = \sum_{b=0}^{B-1} \frac{1}{t_b}$$

In the equation above, b represents the bit position and $t_b$ represents the refresh interval of a particular bit position, b. Thus, the total refresh power, P(t), of a B-bit word is the total sum of the refresh power, Pr, of each bit of the B-bit word.

If the fidelity metric for the B-bit word is MSE (where the fidelity metric for each bit of the B-bit word is BER), the MSE for the B-bit word may be defined as:

$$MSE(t) = \Sigma_{b=0}^{B-1} 4^b g(t_b)$$

In the equation above, b represents the bit position and $t_b$ represents the refresh interval of a particular bit position, b. Further, $g(t_b)$ represents the BER of a particular bit position. $4^b$ represents the differential importance of each position. In other words, the value of $4^b$ changes based upon the bit position. For example, for b=0, $4^b$=1, while for b=7, $4^b$=16384. Additional details of the MSE Equation above may be found in Kim et al., Generalized Water-Filling for Source-Aware Energy-Efficient SRAMS, IEEE Transactions on Communications, Vol. 66, No. 10, October 2018, the entirety of which is incorporated by reference herein.

Thus, based upon the value of $4^b$, the MSE of the B-bit word varies. The above equations may be summarized as follows:

|  | Single bit | B-bit word |
|---|---|---|
| Refresh Interval | t (scalar) | t = $(t_0, t_1, \ldots, t_{B-1})$ (vector, where $t_0$ is the LSB and $t_{B-1}$ is the MSB) |
| Refresh Power Consumption | 1/t | $P(t) = \sum_{b=0}^{B-1} \frac{1}{t_b}$ |
| Fidelity Metric | BER(t) = g(t) | MSE(t) = $\Sigma_{b=0}^{B-1} 4^b\, g(t_b)$ |

A convex optimization problem may be formulated to solve the above equations and determine the optimal refresh interval for a plurality of bit positions of the B-bit word. In some embodiments, an optimal refresh interval may be determined for each bit position of the B-bit word. In other embodiments, an optimal refresh interval may be determined for only some of the bit positions of the B-bit word. Further, in some embodiments, for a given refresh power constraint, an optimal refresh interval may be computed for a bit position of the B-bit word that minimizes the MSE using Equation I:

$$\underset{t}{\text{minimize}}\; MSE(t) = \sum_{b=0}^{B-1} 4^b g(t_b)$$

$$\text{subject to}\; P(t) = \sum_{b=0}^{B-1} \frac{1}{t_b} \leq \mathcal{P}$$

$$\text{where}\; t_b \geq \delta \;\text{and}\; b = 0, 1, \ldots, B-1$$

$\delta$ is a parameter to prevent $t_b$=0 (e.g., infinite refresh power). In some embodiments, $\delta$ may be set to sixty four milliseconds based on refresh intervals used in current DRAM standards. In other embodiments, other values for $\delta$ may be used. $\mathcal{P}$ in the equation above is the desired refresh power constraint.

Further, in some embodiments, a convex optimization problem may be formulated to compute an optimal refresh interval for a bit of the B-bit word that minimizes refresh power consumption for a given MSE using Equation II:

$$\underset{t}{\text{minimize}}\; P(t) = \sum_{b=0}^{B-1} \frac{1}{t_b}$$

$$\text{subject to}\; MSE(t) = \sum_{b=0}^{B-1} 4^b g(t_b)$$

$$\text{where}\; t_b \geq \delta \;\text{and}\; b = 0, 1, \ldots, B-1$$

$\delta$ is the parameter that prevent tb=0 as indicated above.

In some embodiments, the function g(tb) in Equations I and II above may be solved using an exponential relationship, M1, or a lognormal distribution, M2. In other embodiments, other algorithms may be used to solve the function, g(tb). M1 defines the relationship between BER, p, and refresh interval, t, for a bit position, b, as follows:

$$M1{:}\, p = g(t_b) = \alpha\, \exp(\beta t_b)$$

In the equation, M1, $\alpha$ and $\beta$ are constant values that depend upon memory fabrication parameters, and may be estimated via simulation or testing. In some embodiments, $\alpha$=2.7773×10$^{-7}$ and $\beta$=1.9508. In other embodiments, other values may be used for $\alpha$ and $\beta$. Additional details of M1 may be found in Katayama et al., "Fault-tolerant refresh power reduction of DRAMs for quasi-nonvolatile data retention," Pro. IEEE International Symposium on Defect and Fault Tolerance in VLSI Systems (EFT'99), pp. 311-318, November 1999 and Liu et al., "Flikker: Saving DRAM Refresh-power Through Critical Data Partitioning," SIGARCH Comput. Arch. News, vol. 39, no. 1, pp. 213-224, March 2011, the entireties of which are incorporated by reference herein.

M2 defines a retention time distribution that follows a lognormal distribution:

$$M2{:}\; p = g(tb) = \Phi\left(\frac{\log t - \mu}{\sigma}\right)$$

In the equation, M2, p is the BER, t is the refresh interval, $\phi$ is the cumulative distribution function of the normal distribution $$\left(\Phi(x) = \frac{1}{\sqrt{2\pi}} \int_{\infty}^{x} e^{-\frac{t^2}{2}} dt\right),$$

and $\mu$ and $\sigma$ are constant parameters that may be estimated via simulation or testing. In some embodiments, $\mu$=4.4780 and $\sigma$=0.9011. In other embodiments, other values may be used for $\mu$ and a. Additional details for M2 may be found in Hamamoto, et al., "On the retention time distribution of dynamic random access memory (DRAM)," IEEE Trans. Electron Devices, vol. 45, no. 6, pp. 1300-1309, June 1998, the entirety of which is incorporated by reference herein.

Substituting M1 in Equation I gives Equation III as follows:

$$\underset{t}{\text{minimize}}\; MSE(t) = \sum_{b=0}^{B-1} 4^b \alpha \exp(\beta t b)$$

$$\text{subject to}\; P(t) = \sum_{b=0}^{B-1} \frac{1}{t_b} \leq \mathcal{P}$$

$$\text{where}\; t_b \geq \delta$$

Substituting M1 in Equation II gives Equation IV as follows:

$$\underset{t}{\text{minimize}}\; P(t) = \sum_{b=0}^{B-1} \frac{1}{t_b}$$

subject to $MSE(t) = \sum_{b=0}^{B-1} 4^b \alpha \exp(\beta t b)$ where $t_b \geq \delta$ Similarly, substituting M2 in Equation I gives Equation V as follows:

$$\underset{t}{\text{minimize}}\; MSE(t) = \sum_{b=0}^{B-1} 4^b \Phi\left(\frac{\log t - \mu}{\sigma}\right)$$

subject to $P(t) = \sum_{b=0}^{B-1} \frac{1}{t_b} \leq \mathcal{P}$ where $t_b \geq \delta$ And substituting M2 in Equation II gives Equation VI as follows:

$$\underset{t}{\text{minimize}}\; P(t) = \sum_{b=0}^{B-1} \frac{1}{t_b}$$

subject to $MSE(t) = \sum_{b=0}^{B-1} 4^b \Phi\left(\frac{\log t - \mu}{\sigma}\right)$ where $t_b \geq \delta$ In some embodiments, the MSE(t) in Equations III and IV is convex if the BER, p, in M1 is an exponential function. Equations III and IV above may be solved using Karush-Kuhn-Tucker ("KKT") conditions. The KKT conditions define first order optimal conditions provided that a defined regularity condition is satisfied. In other words, the KKT conditions may be used to solve Equations III and IV to obtain optimal refresh intervals for a plurality of bit positions of the B-bit word that minimize MSE for a given refresh power constraint (in Equation III) or minimize the refresh power for a given MSE constraint (in Equation IV). By solving for the KKT conditions in Equations III and IV, an optimal refresh interval vector, t*, may be defined by Equation VII below:

$$t_b^* = \begin{cases} \delta, & \text{if } \frac{v}{4^b} < \alpha\beta\delta^2 \exp(\beta\delta); \\ \frac{2}{\beta} W\left(\frac{\beta}{2}\sqrt{\frac{v}{4^b \alpha \beta}}\right), & \text{otherwise} \end{cases}$$

where W(x): Lambert W function (inverse function of $f(x) = xe^x$ and $\frac{dW(x)}{dx} > 0$ for x>0; and where v: Dual variable of the KKT conditions (depending on refresh power, $\mathcal{P}$, of Equation III above for a given $\alpha$ and $\beta$ values) such that for higher refresh power, $\mathcal{P}$, v is smaller.

For $t_b > \delta$, $$\frac{v}{4^b} = \alpha\beta t_b^2 \exp(\beta t_b)$$

If $\frac{v}{4^b} < \alpha\beta t_b^2 \exp(\beta t_b)$, then $t_b = \delta$

In Equation VII, v depends upon the refresh power constraint, $\mathcal{P}$, for a given $\alpha$ and $\beta$. v may be computed using a bisection method in some embodiments. The bisection method is a root-finding method. The method includes repeatedly bisecting an interval and then selecting a sub-interval in which the function changes sign, and therefore, contains a root. In other embodiments, other or additional methods may be used to compute v.

For example, for solving Equation VII above, the KKT conditions may be defined as follows:

$$\sum_{b=0}^{B-1} \frac{1}{t_b} \leq P,\; v \geq 0,\; v \cdot \left(\sum_{b=0}^{B-1} \frac{1}{t_b} - P\right) = 0 \quad \text{(Equation VIIA)}$$

$t_b \geq \delta,\; \lambda_b \geq 0,\; \lambda_b$ \hfill (Equation VIIB)

$$\frac{\partial L_1}{\partial t_b} = 4^b \alpha\beta \exp(\beta t_b) - \frac{v}{t_b^2} - \lambda_b = 0 \quad \text{(Equation VIIC)}$$

Where $b = 0, 1, \ldots, B-1$

From Equation VIIC above, $\lambda_b$, may be given as follows:

$$\lambda_b = 4^b \alpha\beta \exp(\beta t_b) - \frac{v}{t_b^2} \quad \text{(Equation VIID)}$$

From Equations VIM and VIID:

$$\lambda_b(t_b - \delta) = \left(4^b \alpha\beta \exp(\beta t_b) - \frac{v}{t_b^2}\right)(t_b - \delta) = 0 \quad \text{(Equation VIIE)}$$

Assuming v in Equation VIIE above is zero. Then:

$\lambda_b = 4^b \alpha\beta \exp(\beta t_b) \neq 0$ \hfill (Equation VIIF)

Solving Equation VIIF, the corresponding refresh power may be given by:

$$P(\delta, \ldots, \delta) = \frac{B}{\delta}$$

If $$\frac{B}{\delta}$$

is less than the refresh power constraint, $\mathcal{P}$, then the MSE is minimized. However, when $$\frac{B}{\delta}$$

is greater than the refresh power constraint, $\mathcal{P}$, then:

$v \neq 0$

In such cases, Equation VIIA changes as follows:

$$\sum_{b=0}^{B-1} \frac{1}{t_b} = P \quad \text{(Equation VIIG)}$$

If $\lambda_b$ is greater than zero, then:

$$t_b = \delta \quad \text{(Equation VIIH)}$$

Then, from VIIC, the condition $\lambda_b$ is greater than zero is equivalent to:

$$\frac{v}{4^b} < \alpha \beta t_b^2 \exp(\beta t_b) \quad \text{(Equation VIII)}$$

From Equations VIIE, VIIH, and VIII:

$$t_b^* = \delta \text{ for } \frac{v}{4^b} < \alpha \beta t_b^2 \exp(\beta \delta) \quad \text{(Equation VIIJ)}$$

If, $\lambda_b = 0$, then:

$$\alpha \beta t_b^2 \exp(\beta t_b) = \frac{v}{4^b} \quad \text{(Equation VIIK)}$$

Equation VIIK is equivalent to:

$$\frac{\beta t_b}{2} \exp\left(\frac{\beta t_b}{2}\right) = \left(\frac{\beta}{2} \sqrt{\frac{v}{4^b \alpha \beta}}\right) \quad \text{(Equation VIIL)}$$

By setting $$x = \frac{\beta t_b}{2}$$

in Equation VIIL:

$$x \exp(x) = \left(\frac{\beta}{2} \sqrt{\frac{v}{4^b \alpha \beta}}\right) \text{ or}$$

$$W\left(\frac{\beta}{2} \sqrt{\frac{v}{4^b \alpha \beta}}\right) = x = \frac{\beta t_b}{2},$$

i.e., $t_b = \frac{2}{\beta} W\left(\frac{\beta}{2} \sqrt{\frac{v}{4^b \alpha \beta}}\right)$ Additional details for solving Equations III, IV, and VII using KKT conditions may be found in Kim et al., "On the Optimal Refresh Power Allocation for Energy-Efficient Memories," Proc. IEEE Global Communications Conference, December 2019, the entirety of which is incorporated by reference herein.

Equation VII, thus, provides, a B-bit vector with optimal refresh intervals for a plurality of bit positions, b, of the B-bit word. Further, in some embodiments, if the computed optimal refresh interval, t, is less than the value of $\delta$, the refresh interval control system 405 may be configured to replace the computed optimal refresh interval with the value of $\delta$. Thus, in such cases, the minimum refresh is equal to the value of $\delta$.

Similarly, Equations V and VI above may be solved using KKT conditions. For example, an optimal refresh interval vector, t*, may be defined by Equation VIII below:

$$t_b^* = \begin{cases} \delta, & \text{if } \frac{v}{4^b} < \frac{\delta}{\sqrt{2\pi} \cdot \sigma} \exp\left(-\frac{(\log \delta - \mu)^2}{2\sigma^2}\right) \\ \exp(\mu + \sigma^2) \exp\left(-\sigma \sqrt{2\mu + \sigma^2 - 2\log(\sqrt{2\pi} v \sigma) + 2b \log 4}\right), & \text{otherwise} \end{cases}$$

In Equation VIII, v: Dual variable from KKT conditions (depending on refresh power) such that for higher refresh power, v is smaller. As discussed above, v may be computed using a bisection method in some embodiments. $\mu$ and $\sigma$ are constant parameters. In some embodiments, $\mu = 4.4780$ and $\sigma = 0.9011$. In other embodiments, other values may be used for $\mu$ and $\sigma$. By solving Equation VIII, a B-bit vector with optimal refresh intervals for each bit position, b, of the B-bit word may be obtained.

The KKT conditions for Equation VIII may be given as:

$$\sum_{b=0}^{B-1} \frac{1}{t_b} \leq P, v \geq 0, v \cdot \left(\sum_{b=0}^{B-1} \frac{1}{t_b}\right) = 0 \quad \text{(Equation VIIIA)}$$

$$t_b \geq \delta, \lambda_b \geq 0, \lambda_b(t_b - \delta) = 0 \quad \text{(Equation VIIIB)}$$

$$\frac{\partial L_2}{\partial t_b} = \frac{4^b}{\sqrt{2\pi} \sigma} \cdot \frac{\exp\left\{-\frac{(\log t_b - \mu)^2}{2\sigma^2}\right\}}{t_b} - \frac{v}{t_b^2} - \lambda_b = 0 \quad \text{(Equation VIIIC)}$$

Where $b = 0, 1, \ldots, B - 1$

From Equation VIIIC, $\lambda_b =$ $$\lambda_b = \frac{1}{t_b}\left(\frac{4^b}{\sqrt{2\pi} \sigma} \exp\left\{-\frac{(\log t_b - \mu)^2}{2\sigma^2}\right\} - \frac{v}{t_b}\right) \quad \text{(Equation VIIID)}$$

From Equations VIIIB and VIIID:

$$\lambda_b(t_b - \delta) = \quad \text{(Equation VIIIE)}$$

$$\left[\frac{4^b}{\sqrt{2\pi} \sigma} \exp\left\{-\frac{(\log t_b - \mu)^2}{2\sigma^2}\right\} - \frac{v}{t_b}\right]\frac{t_b - \delta}{t_b} = 0$$

Assuming ν in Equation VIIIE above is zero. Then, $\lambda_b > 0$ and $t_b = \delta$ for $b = 0, 1, \ldots, B-1$. The corresponding refresh power may be given by:

$$P(\delta, \ldots, \delta) = \frac{B}{\delta}$$

If $$\frac{B}{\delta}$$

is less than the refresh power constraint, $\mathcal{P}$, then the MSE is minimized. However, when $$\frac{B}{\delta}$$

is greater than the refresh power constraint, $\mathcal{P}$, then:

$$\nu \neq 0$$

In such cases, Equation VIIA changes as follows:

$$\sum_{b=0}^{B-1} \frac{1}{t_b} = P \qquad \text{(Equation VIIIF)}$$

If $\lambda_b$ is greater than zero, then:

$$t_b = \delta \qquad \text{(Equation VIIIG)}$$

By Equation VIIIC, the condition $\lambda_b$ is greater than zero is equivalent to:

$$\frac{\nu}{4^b} < \frac{t_b}{\sqrt{2\pi}\,\sigma} \exp\left\{-\frac{(\log t_b - \mu)^2}{2\sigma^2}\right\} \qquad \text{(Equation VIIIH)}$$

From Equation VIIIE:

$$t_b^* = \delta \text{ for } \frac{\nu}{4^b} = \frac{t_b}{\sqrt{2\pi}\,\sigma} \exp\left\{-\frac{(\log t_b - \mu)^2}{2\sigma^2}\right\} \qquad \text{(Equation VIIII)}$$

If $\lambda_b = 0$, then from equation VIIII:

$$\frac{\nu}{4^b} = \frac{t_b}{\sqrt{2\pi}\,\sigma} \exp\left\{-\frac{(\log t_b - \mu)^2}{2\sigma^2}\right\} \qquad \text{(Equation VIIIJ)}$$

Equation VIIIJ is equivalent to:

$$\frac{\sqrt{2\pi}\,\sigma \nu}{4^b} = t_b \exp\left\{-\frac{(\log t_b - \mu)^2}{2\sigma^2}\right\} \qquad \text{(Equation VIIIK)}$$

Taking the logarithm of Equation VIIIK:

$$\log \frac{\sqrt{2\pi}\,\sigma \nu}{4^b} = \log t_b - \frac{(\log t_b - \mu)^2}{2\sigma^2} \qquad \text{(Equation VIIIL)}$$

By setting $x = \log t_b$ in Equation VIIIL, the following polynomial may be obtained:

$$x^2 - 2(\mu + \sigma^2)x + \mu^2 + 2\sigma^2 \log \frac{\sqrt{2\pi}\,\sigma \nu}{4^b} = 0 \qquad \text{(Equation VIIIM)}$$

Therefore, the solution of Equation VIIIM may be given by:

$$\log t_b = \mu + \sigma^2 \pm \sqrt{2b\log 4 + 2\mu + \sigma^2 - 2\log \sqrt{2\pi}\,\nu\sigma} \qquad \text{(Equation VIIIN)}$$

Because of the condition $t_b < \exp(\mu - \sigma^2)$, the optimal refresh interval, $t_b^*$, may be given by:

$$t_b = e^{\mu + \sigma^2} e^{-\sqrt{2b\log 4 + 2\mu + \sigma^2 - 2\log \sqrt{2\pi}\,\nu\sigma}} = c_1 e^{-\sqrt{2b\log 4 + c_2}}$$

Additional details for solving Equations V, VI, and VIII using KKT conditions may be found in Kim et al., "On the Optimal Refresh Power Allocation for Energy-Efficient Memories," Proc. IEEE Global Communications Conference, December 2019, the entirety of which is incorporated by reference herein.

Although KKT conditions are described herein for solving Equations III-VIII, in other embodiments, other optimization algorithms that are considered suitable may be employed. Similarly, although M1 and M2 functions are used for obtaining the Equations in other embodiments, other suitable functions may be used.

The previous equations assume that any real values may be assigned to the refresh interval, t, so long as those values are equal to or greater than the value (e.g., sixty four milliseconds) of parameter, $\delta$. In some embodiments, it may be desirable to assign optimal refresh interval values that are discrete, or in other words, multiples of the value (e.g., sixty four milliseconds) of the parameter, $\delta$. For example, if the refresh interval of a particular bit position, tb, is $\gamma \delta z_b$ where $\gamma, z_b \in \mathbb{N}$: positive integers, then Equation III may be reformulated as Equation IX as follows:

$$\underset{z}{\text{minimize}}\, MSE(z) = \sum_{b=0}^{B-1} 4^b \alpha \exp(\beta \gamma \delta \cdot z_b)$$

$$\text{subject to } P(z) = \frac{1}{\gamma \delta}\sum_{b=0}^{B-1} \frac{1}{t_b} \leq \mathcal{P}$$

where $z_b \in \mathbb{N}$

Similarly, Equations IV, V, and VI may be reformulated by substituting tb in those equations with $\gamma \delta z_b$, as indicated above. Instead of using the KKT conditions to solve Equation IX and the equations obtained by substituting tb in equations IV, V, and VI, a standard mixed-integer non-linear program solver or other general integer non-linear programming solutions may be used. By solving these equations, an optimal refresh interval that is discrete, or in other words, a multiple of the value of parameter, δ, may be obtained for a plurality of bit-positions of a B-bit word.

Further, as indicated above, PSNR may be used as a fidelity metric instead of MSE. PSNR is inversely proportional to MSE:

$$\text{PSNR} = 10 \log_{10}((2^B - 1)^2)/\text{MSE}$$

Therefore, if PSNR is desired as the fidelity metric, then MSE may be computed as discussed herein and the PSNR may be computed from the MSE using the formula above.

Further, in some embodiments, the granularity of the number of optimal refresh intervals may be controlled. For example and as discussed above, for a B-bit word, an optimal refresh interval is computed for each bit position. In some embodiments, each bit position may have a different value of the optimal refresh interval, such that the granularity of the refresh interval is eight. In some embodiments, a lower granularity may be desired. For example, it may be desired that the first four bits of an eight-bit word may have a first optimal refresh interval while the last four bits of the eight-bit word have a second optimal refresh interval. Thus, two different values of the optimal refresh intervals are used, leading to a granularity of two for the refresh interval. Similarly, in some embodiments, a granularity of four may be used such that pairs of bits have the same optimal refresh interval. Thus, the granularity of the refresh interval may vary between two and eight.

Additionally, regardless of the granularity that is used, the optimal refresh interval that is computed for each bit position is still based upon the relative importance of the bit positions. For example, when a granularity of two is used such that half the bit positions have the first optimal refresh interval and the other half have a second optimal refresh interval, the values of the first optimal refresh interval and the second optimal refresh interval are based upon the relative bit positions. Specifically, the bit positions that are towards the MSB have a shorter optimal refresh interval compared to the bit positions that are towards the LSB. Thus, in an eight-bit word having a granularity of two for the refresh interval, the four bits closest to the MSB have a shorter optimal refresh interval than the four bits closest to the LSB.

In some embodiments, the optimal refresh intervals that are used for the refresh operations may be selected based upon the granularity that is desired. For example, for a B-bit word, the optimal refresh intervals may be computed for each bit position as discussed above. From these computed optimal refresh intervals, certain values may be selected based on the desired granularity. For example, when the granularity is two, in some embodiments, the optimal refresh interval for the LSB may be used for other bit positions as well that are closest to the LSB regardless of the optimal refresh interval that is computed for those bit positions (e.g., if the computed optimal refresh interval for those other bit positions varies from the optimal time interval for the LSB, the optimal time interval for the LSB may be used for those other bit positions as well). Similarly, the optimal refresh interval for the MSB may be used for those half of the bit positions that are closest to the MSB regardless of the optimal refresh interval computed for those other bit positions.

In other embodiments, the granularity may be considered when computing the optimal refresh intervals. For example, in the Equations above that use refresh interval, tb, certain equality conditions may be applied based on the granularity:

$$t_0 = \ldots = t_{j-1}$$

$$t_j = \ldots = t_{B-1}$$

In the equation above, bit positions, $t_0$-$t_{j-1}$ have the same granularity, while the bit positions, $t_j$-$t_{B-1}$ have the same granularity, providing a granularity of two. The above equation may be modified based upon the desired granularity.

Thus, the refresh interval control system 405 determines optimal refresh intervals for a plurality of bit positions of a B-bit word to satisfy a given fidelity metric and resource metric. Further, the optimal refresh interval for the plurality of bit positions is based upon the relative importance of each bit position. In some embodiments, the MSB may be considered more important than the LSB. In such cases, the optimal refresh interval of the MSB is shorter than the optimal refresh interval of the LSB. In other embodiments, the LSB may be considered more important than the MSB. In these cases, the optimal refresh interval of the LSB is shorter than the MSB. In yet other embodiments, bit positions other than the LSB and MSB may be considered more important. In these cases, these bit positions have a shorter optimal refresh interval than the LSB and MSB. Thus, the optimal refresh interval for each bit position is based upon that bit position's relative importance in a B-bit word.

The refresh interval control system 405 may be configured to determine the relative importance of the plurality of bit positions for whom the optimal refresh intervals are to be determined. In some embodiments, the relative importance may be based upon the application. For example and as indicated above, in machine learning and signal processing applications, MSB is more important than LSB. In some embodiments, other designated criteria may be used to determine the relative importance of each bit position. In some embodiments, the memory controller 425 may provide an indication of the relative importance of each position to the refresh interval control system 405.

Upon determining the optimal refresh intervals for each bit position, the refresh interval control system 405 may refresh those bit positions in accordance with the optimal refresh intervals. Thus, the refresh interval control system 405 may apply a different refresh interval to each of the sub-arrays 415A-415N based upon the computed optimal refresh interval for that bit position and the sub-array storing the bit corresponding to that bit position. For example and as shown in FIG. 4, if the optimal refresh intervals computed, as discussed above, for an eight-bit word are t=(t0, t1, t2, t7) where t0 is the optimal refresh interval for LSB and t7 for MSB, the refresh interval control system 405 may perform a refresh operation on the sub-array 415A at t0 refresh intervals, on the sub-array 415B at t1 refresh intervals, on the sub-array 415N at t7 refresh intervals, and so on. The refresh interval control system 405 may be in communication with the interleaver 410 or otherwise know which one of the sub-arrays 415A-415N store which bit positions.

Therefore, based upon the relative importance of a bit position, the optimal refresh interval may vary. In some embodiments, optimal refresh interval values for a bit position of a B-bit word may be computed before-hand for various combinations of fidelity metric and resource metric, and stored in a look-up table of the refresh interval control system 405. The inputs to the look-up table may be the desired fidelity metric and/or the desired resource metric, and the output may be the optimal refresh intervals for each bit position of a B-bit word. For example, to minimize MSE and achieve a desired refresh power consumption, in some embodiments, the desired refresh power consumption constraint may be used as an input to the look-up table. The minimum MSE from all records in the look-up table having the desired refresh power consumption constraint may be selected. The refresh intervals corresponding to the minimum MSE may then give the optimal refresh intervals of one or more bit positions of a B-bit word. For example, for an eight-bit word, the look-up table may output up to eight optimal refresh interval values, one for each of the eight bit positions. In other embodiments, the minimum MSE may be used as an input to the look-up table. From all records with the minimum MSE, the record corresponding to the desired refresh power consumption may be selected to output the optimal refresh intervals.

Similarly, in some embodiments, to minimize refresh power and achieve a given MSE, the MSE may be used an input to the look-up table. If multiple records are found for the MSE in the look-up table, the record with the minimum refresh power value may be selected. The refresh intervals corresponding to that minimum refresh power may then provide the optimal refresh intervals for each bit position of the B-bit word. In other embodiments, the record(s) with the minimum refresh power may be selected. Form those record(s), the record with the desired MSE may be selected to output the optimal refresh intervals. In some embodiments, the granularity of the refresh interval may also be used as an input to determine the optimal refresh intervals. Thus, the look-up table may be structured in a variety of ways. In other embodiments, mechanisms other than a look-up table may be used to determine the optimal refresh intervals for each bit position.

The refresh interval control system 405 and the interleaver 410 may be part of the memory controller 425. In other embodiments, either or both of the refresh interval control system 405 and the interleaver 410 may be separate from the memory controller 425. Further, although not shown, either or both of the refresh interval control system 405 and the interleaver 410 may be configured in software, hardware, firmware, or combinations thereof. Generally speaking, each of the refresh interval control system 405 and the interleaver 410 may include a memory to store instructions and a processing unit or processor configured to execute those instructions to perform the functions or operations described herein.

Figure 5A:
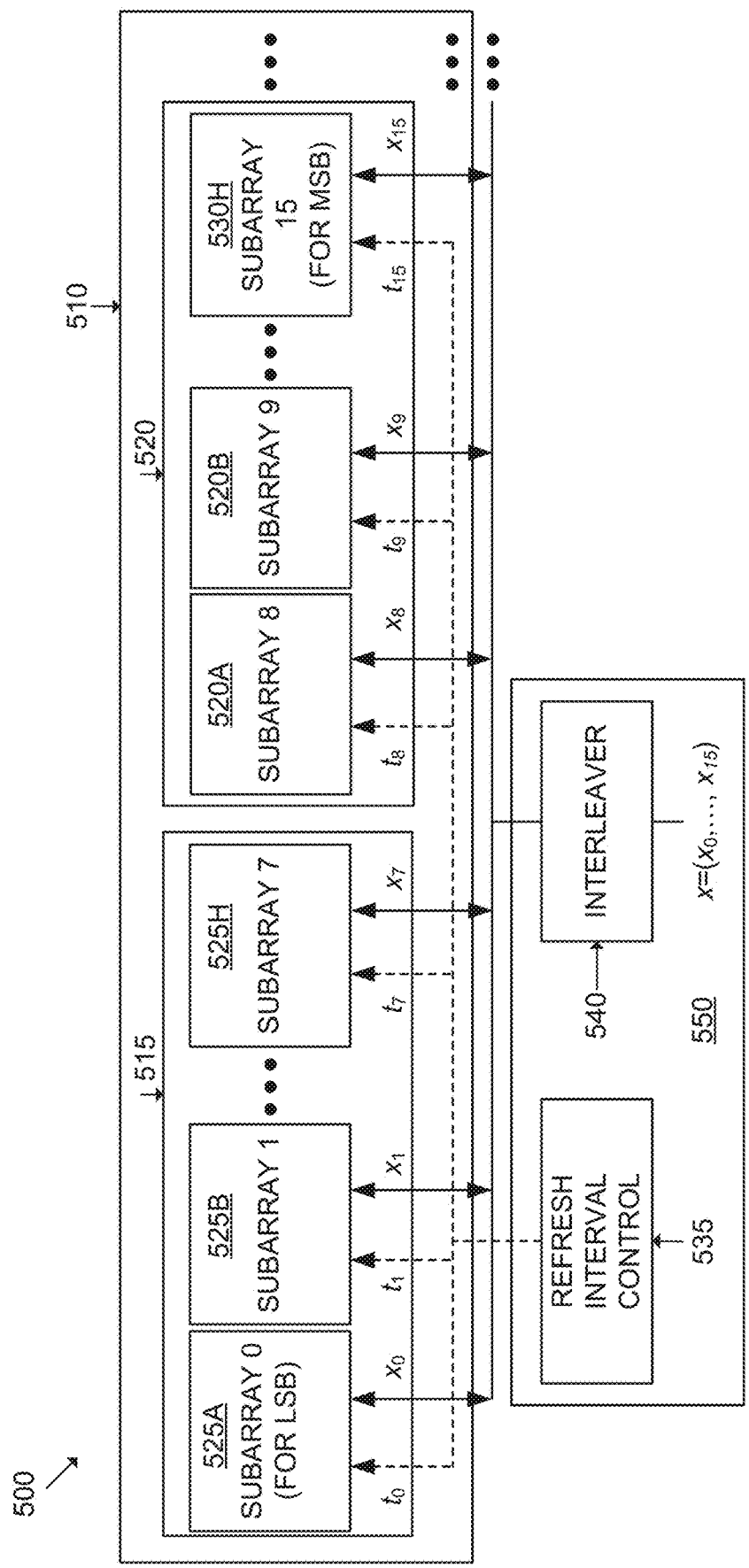
FIG. 5A is an example block diagram showing another example of the refresh system of FIG. 4, in accordance with some embodiments of the present disclosure.
Figure 5B:
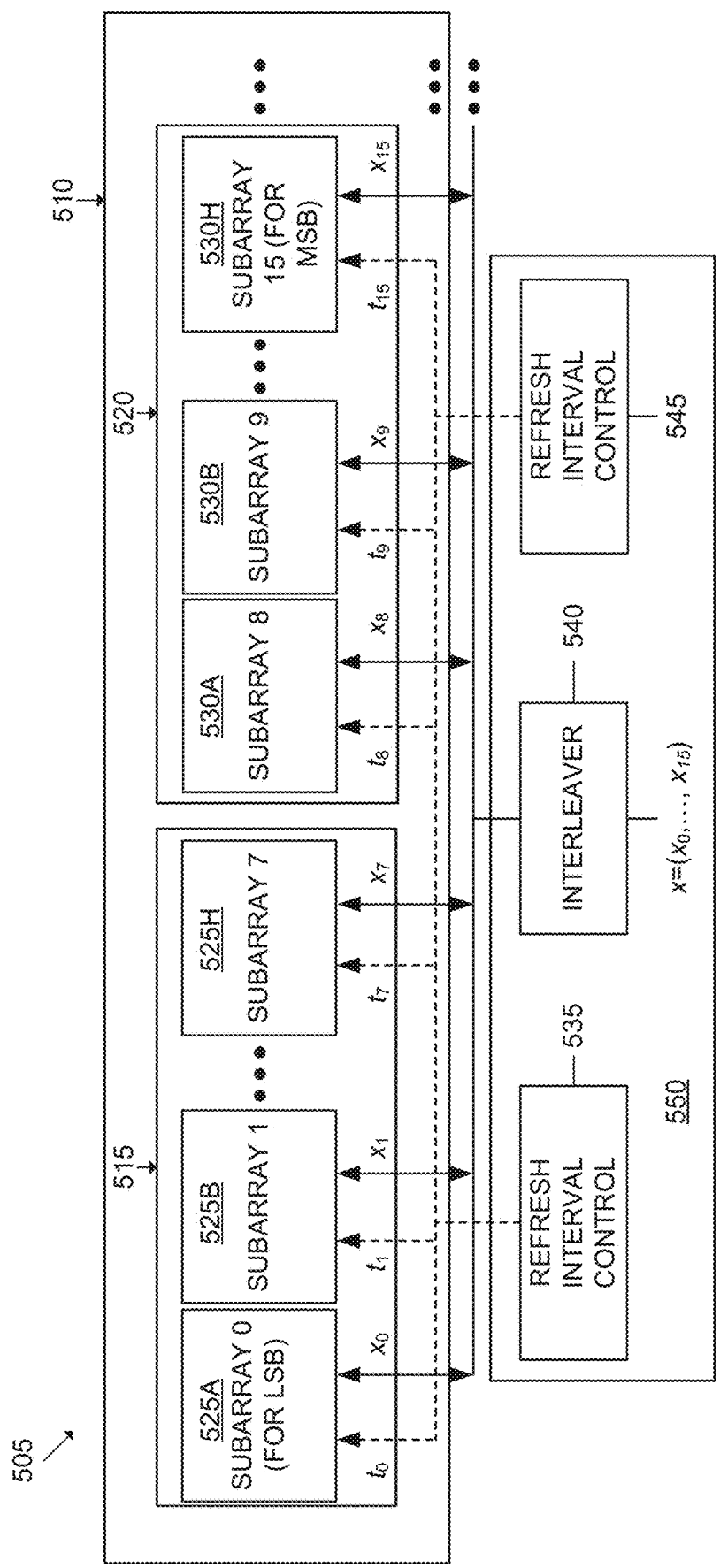
FIG. 5B is an example block diagram showing yet another example of the refresh system of FIG. 4, in accordance with some embodiments of the present disclosure.

Turning to FIGS. 5A and 5B, example block diagrams of a refresh system 500 and a refresh system 505, respectively, are shown, in accordance with some embodiments of the present disclosure. The refresh systems 500 and 505 provide extensions for the refresh system 400. In some embodiments, the refresh system 400 of FIG. 4 may be used for an eight-bit word. In other words, the DRAM module 420 may include eight sub-arrays to store an eight-bit word. The refresh systems 500 and 505 may be used when words greater than eight bits are desired to be stored. For example, the refresh systems 500 and 505 may be stored for storing a sixteen bit word. To store a sixteen bit word, two groups of sub-arrays may be used in a DRAM module 510. For example, the DRAM module 510 may include a first group 515 and a second group 520. The first group 515 may include eight sub-arrays 525A-525H and the second group may include eight sub-arrays 530A-530H. The sub-arrays in each of the first group 515 and the second group 520 may be configured similar to the sub-arrays 415A-415N of FIG. 4.

The first group 515 may be configured to store eight bits of the sixteen bit word and the second group may be configured to store the remaining eight bits of the sixteen bit word. For example, for data x=(x0, x1, x2, . . . , x15) where x0 is the LSB and x15 is the MSB, bits x0-x7 may be stored in the first group 515 and the bits x8-x15 may be stored in the second group 520. In some embodiments, the bits x0-x7 may be stored in the second group and the bits x8-x15 may be stored in the first group 515. The particular sub-array in which a particular bit is stored does not matter so long as a refresh interval control system 535 knows which sub-array stores which bit position. An interleaver 540 may be configured to store each bit in the designated sub-array, similar to the interleaver 410.

Further, in some embodiments and as shown in FIG. 5A, a single instance of the refresh interval control system 535 may be used to compute the optimal refresh intervals for each of the sub-arrays 525A-525H and 530A-530H of the first group 515 and the second group 520, respectively. Alternatively and as shown in FIG. 5B, a separate instance of the refresh interval control system may be used for each group. For example, the refresh interval control system 535 may be used to compute the optimal refresh intervals for the sub-arrays 525A-525 in the first group 515 and a second refresh interval control system 545 may be used to compute the optimal refresh intervals for the sub-arrays 530A-530H in the second group 520. For word sizes greater than sixteen bits, additional groups of sub-arrays may be formed and may be controlled by one or more refresh interval control systems. In some embodiments, a single group having greater than eight sub-arrays may be used. For example, in some embodiments, a single group having sixteen sub-arrays to accommodate a sixteen bit word may be used. Thus, depending upon the word size, the configuration of the refresh system may vary.

Figure 6:
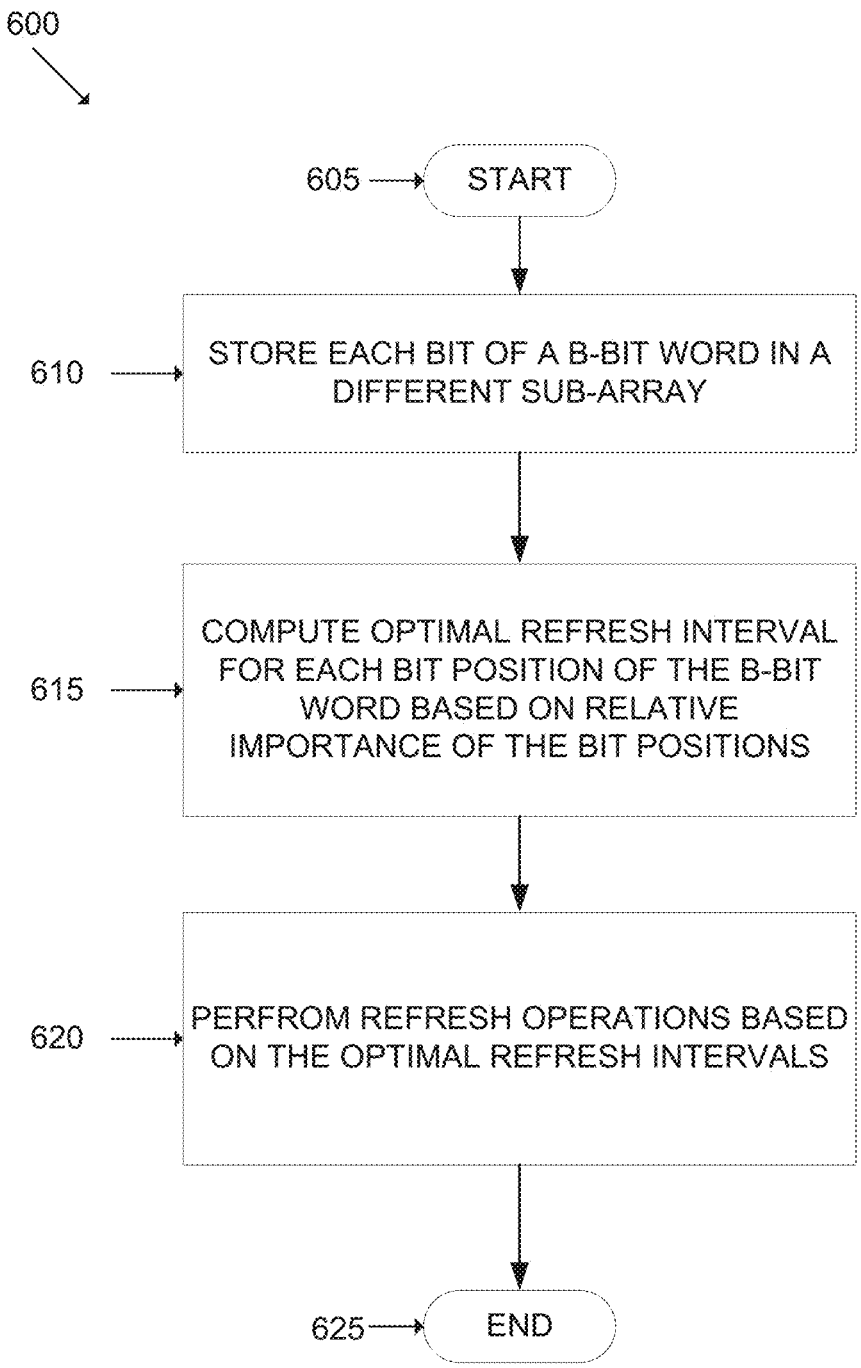
FIG. 6 is an example flowchart outlining operations implemented by the refresh system of FIGS. 4-5B for refreshing data stored in the DRAM memory chip of FIG. 2, in accordance with some embodiments of the present disclosure.

Referring to FIG. 6, an example flowchart outlining operations of a process 600 performing refresh operations based on relative importance of bit positions is shown, in accordance with some embodiments of the present disclosure. The process 600 may include additional or other operations depending upon the particular embodiment. The process 600 may be implemented by the refresh systems 400, 500, 505. The description below is with respect to the refresh system 400. However, the process 600 is also applicable to the refresh systems 500 and 505.

Upon starting at operation 605, the refresh system 400, and particularly, the interleaver 410 of the refresh system, receives an instruction (e.g., from the host device 105) to store a B-bit word in the DRAM module 420. The interleaver 410 stores each bit of the B-bit word in a separate one of the sub-arrays 415A-415N of the DRAM module 420. The interleaver 410 knows which sub-array is configured for storing which bit position. Thus, the interleaver 410 stores the MSB in the sub-array (e.g., the sub-array 415N) configured to store MSB, stores the LSB in the sub-array (e.g., the sub-array 415A) configured to store LSB, and stores the remaining bits in the sub-arrays configured to store the bit positions of the remaining bits.

At operation 615, the refresh system 400, and particularly, the refresh interval control system 405 of the refresh system, computes an optimal refresh interval for a plurality of bit positions of the B-bit word stored at the operation 610. In some embodiments, the refresh interval control system 400 may first determine the relative importance of the various bit positions before computing their optimal refresh intervals. The refresh interval control system 405 may also receive a fidelity metric and a resource metric from the memory controller 425 and/or the host device (e.g., the host device 105). The refresh interval control system 405 may also receive the granularity of the optimal refresh interval. Based on the fidelity metric, the resource metric, and the granularity, the refresh interval control system 405 computes an optimal refresh interval for each bit position, as discussed above, at operation 615. In some embodiments, upon receiving the fidelity metric, the resource metric, and the granularity, the refresh interval control system 405 may use a look-up to determine the optimal refresh intervals. At operation 620, the refresh interval control system 405 performs a refresh operation on the sub-arrays 415A-415N based on the optimal refresh intervals.

In some embodiments, the refresh interval control system 405 may be configured to perform the refresh operations. In other embodiments, a separate refresh operation system may receive the optimal refresh intervals from the refresh interval control system 405 and perform the refresh operations. A refresh operation involves periodically reading data from a DRAM memory cell and immediately rewriting the data to the same DRAM memory cell without modification, thereby restoring the charge to the capacitor (e.g., the capacitor 325) associated with that DRAM memory cell. Reading and writing of data to a DRAM memory cell may be performed as discussed above in FIG. 3.

Further, the refresh operations may be performed at intervals defined by the optimal refresh interval. For example, if the refresh interval is one hundred milliseconds, a refresh operation may be executed every one hundred milliseconds. Further, each of the sub-arrays 415A-415N may be refreshed based on their designated optimal time interval. For example, if the sub-array 415A has an optimal refresh interval, T1, and the sub-array 415B has an optimal refresh interval, T2, a refresh operation may be performed on the sub-array 415A based on the optimal refresh intervals, T1, and the refresh operations may be performed on the sub-array 415B based on the optimal refresh intervals, T2. Thus, the sub-arrays 415A-415N may be refreshed at different times. However, all DRAM memory cells that form part of the sub-array being refreshed may be refreshed at the same time using the optimal refresh interval computed for that sub-array. The process 600 ends at operation 625.

Figure 7:
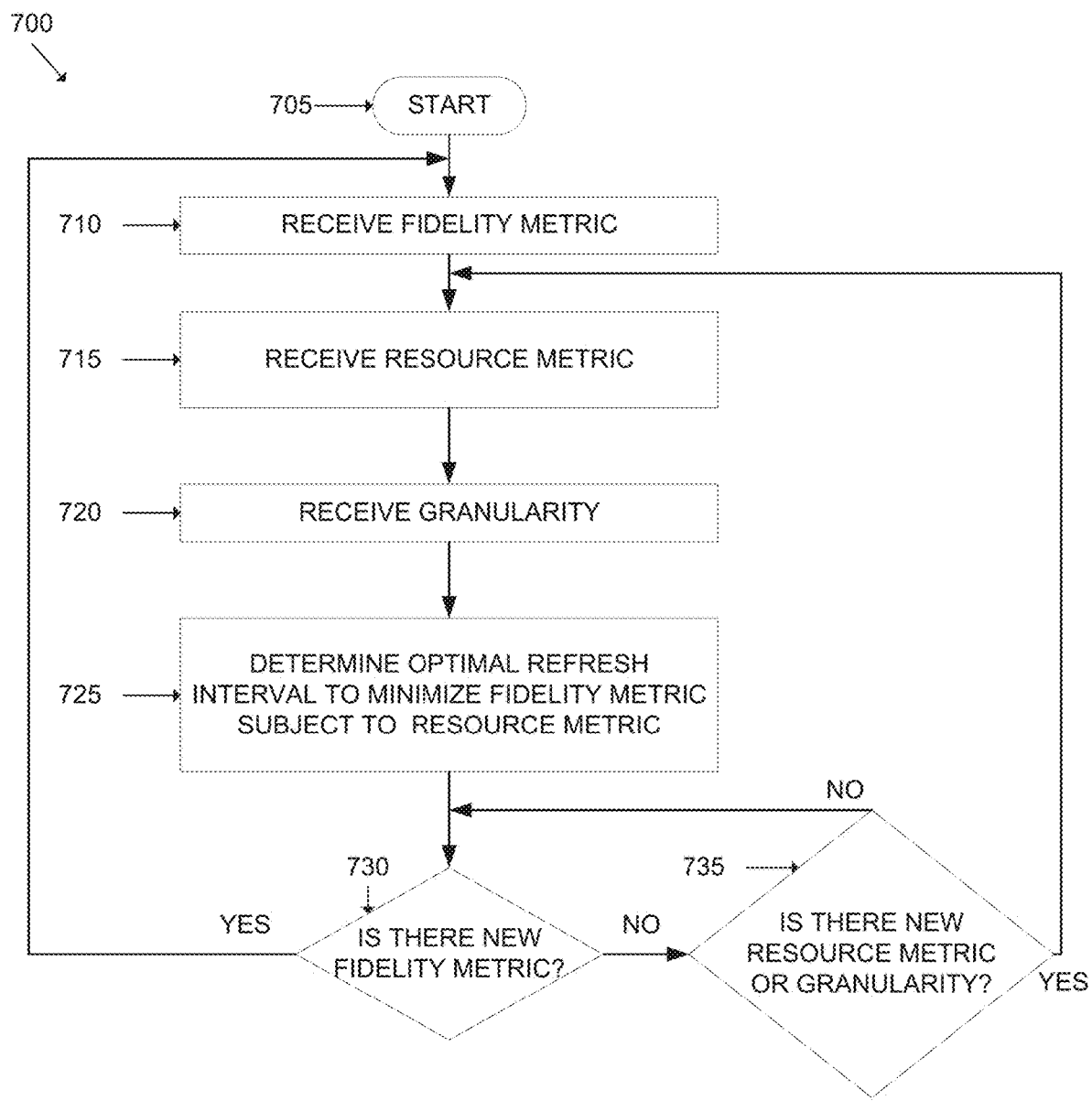
FIG. 7 is an example flowchart outlining certain operations of the flowchart of FIG. 6 in greater detail, in accordance with some embodiments of the present disclosure.

Turning now to FIG. 7, an example flowchart outlining operations of a process 700 is shown, in accordance with some embodiments of the present disclosure. The process 700 may include additional or other operations depending upon the particular embodiment. The process 700 may be implemented by the refresh systems 400, 500, 505. The description below is with respect to the refresh system 400. However, the process 700 is also applicable to the refresh systems 500 and 505. The process 700 may be used to compute an optimal refresh interval for a bit position of a B-bit word. Specifically, the process 700 may be used to compute optimal refresh intervals that minimize a fidelity metric while achieving a given resource metric constraint. The process 700 describes the operation 615 in greater detail. The process 700 starts when a new B-bit word is stored within the DRAM module 420. The process 700 may also be implemented for words that were previously stored within the DRAM module 420.

Thus, upon starting at the operation 705, the refresh system 400, and particularly, the refresh interval control system 405 of the refresh system receives a fidelity metric that is to be minimized. As indicated above, the fidelity metric may be MSE, PSNR, or other desired metric. The process 700 has been explained below with respect to MSE. However, the process 700 may also be used when the fidelity metric is PSNR or another metric. At the operation 710, the refresh interval control system 405 receives the fidelity metric of MSE. In some embodiments, the refresh interval control system 405 may receive the fidelity metric from the memory controller 425, which in turn may have received the fidelity metric from the host device 105. In other embodiments, the refresh interval control system 405 may receive the fidelity metric directly from the host device 105 or from another component of the computing device with which the refresh interval control system is associated. At operation 715, the refresh interval control system 405 may receive a resource metric. In some embodiments, the resource metric may be refresh power. In other embodiments, other resource metrics may be used. The refresh interval control system 405 may receive the resource metric in a similar way as the fidelity metric. In other words, the refresh interval control system 405 may receive the resource metric from the memory controller 425, the host device 105, or any other component of the computing system with which the refresh interval control system is associated.

At operation 720, the refresh interval control system 405 optionally receives a granularity of the refresh interval. As discussed above, in some embodiments, each bit position of the B-bit word may have a different optimal refresh interval. In such cases, the granularity is "B" for a B-bit word. In other embodiments, a smaller granularity may be used such that the same optimal refresh interval may be used for multiple bit positions of a B-bit word. The refresh interval control system 405 may receive the granularity from the memory controller 425, the host device 105, or any other component of the computing system with which the refresh interval control system is associated. Although the process 700 has been described as receiving the fidelity metric before the resource metric, which is described as being received before the granularity, it is to be understood that the fidelity metric, resource metric, and granularity may be received in any order.

Upon receiving the fidelity metric, the resource metric, and the granularity, the refresh interval control system 405 determines the optimal refresh interval for each bit position of the B-bit word, as discussed above. Specifically, the refresh interval control system 405 determines the optimal refresh interval for each bit position to minimize the fidelity metric received at the operation 710 while achieving the resource metric received at the operation 715. The refresh interval control system 405 also applies equality conditions to the refresh interval, as discussed above, to achieve the granularity received at the operation 720. In some embodiments, the refresh interval control system 405 may use a look-up table for determining the optimal refresh interval for each bit position. For example, the refresh interval control system 405 may use one or more of the fidelity metric, resource metric, or granularity as input to output B values of the optimal refresh interval, such that each of the B values corresponds to the optimal refresh interval for one bit position of the B-word. Further, the refresh interval control system 405 may compute the optimal refresh intervals such that more important bit positions have a shorter optimal refresh interval than lesser important bit positions. For example, in some embodiments, the MSB may have a shorter optimal refresh interval than the LSB. In some embodiments, the refresh interval may increase from the MSB to the LSB subject to the granularity.

The refresh interval control system 405 or another designated component performs refresh operations on the sub-arrays 415A-415N in which the various bits of the B-word are stored. In some embodiments, the sub-array (e.g., the sub-array 415N) in which the MSB is stored may have the shortest optimal refresh interval and the sub-array 415A in which the LSB is stored may have the longest refresh interval for the B-bit word. The refresh interval control system 405 or the another designated component continues to perform refresh operations using the optimal refresh intervals of the operation 725 until a new fidelity metric is received at operation 730. Thus, at the operation 730, the refresh interval control system 405 may determine if a new fidelity metric is received. The refresh interval control system 405 may check for a new fidelity metric periodically or upon satisfying predetermined conditions.

The new fidelity metric of the operation 730 may be a different metric than the one received previously at the operation 710 or the new fidelity metric may be a different value of the same metric received at the operation 710. In other words, if the fidelity metric previously received at the operation 710 is MSE, the new fidelity metric received at the operation 730 may be PSNR or a different value of MSE. The new fidelity metric may be received in the same or similar way as the fidelity metric received at the operation 710. If a new fidelity metric is received at the operation 730, the process 600 loops back to the operation 710 and repeats the operations 710-725. If no new fidelity metric is received at the operation 710, in some embodiments, the refresh interval control system 405 may determine if a new resource metric or granularity is received at operation 735. If no new resource metric and no new granularity is received at the operation 735, the refresh interval control system 405 goes back to the operation 730 and continues to monitor for updates to the fidelity metric. If a new resource metric is received at the operation 735, the process 600 loops back to the operation 715, as shown in FIG. 7, and repeats the operation 715-725 using the fidelity metric that was previously received at the operation 710. If a new granularity is received at the operation 735, the process 700 loops back to the operation 720 (not shown in FIG. 7) and repeats the operation 725 using the fidelity metric previously received at the operation 710 and the resource metric previously received at the operation 715.

Thus, the process 700 provides a mechanism to dynamically, in substantially real-time, update the optimal refresh intervals of each bit position of a B-bit word depending upon the relative importance of the bit positions, while achieving desired fidelity and resource metrics.

Figure 8:
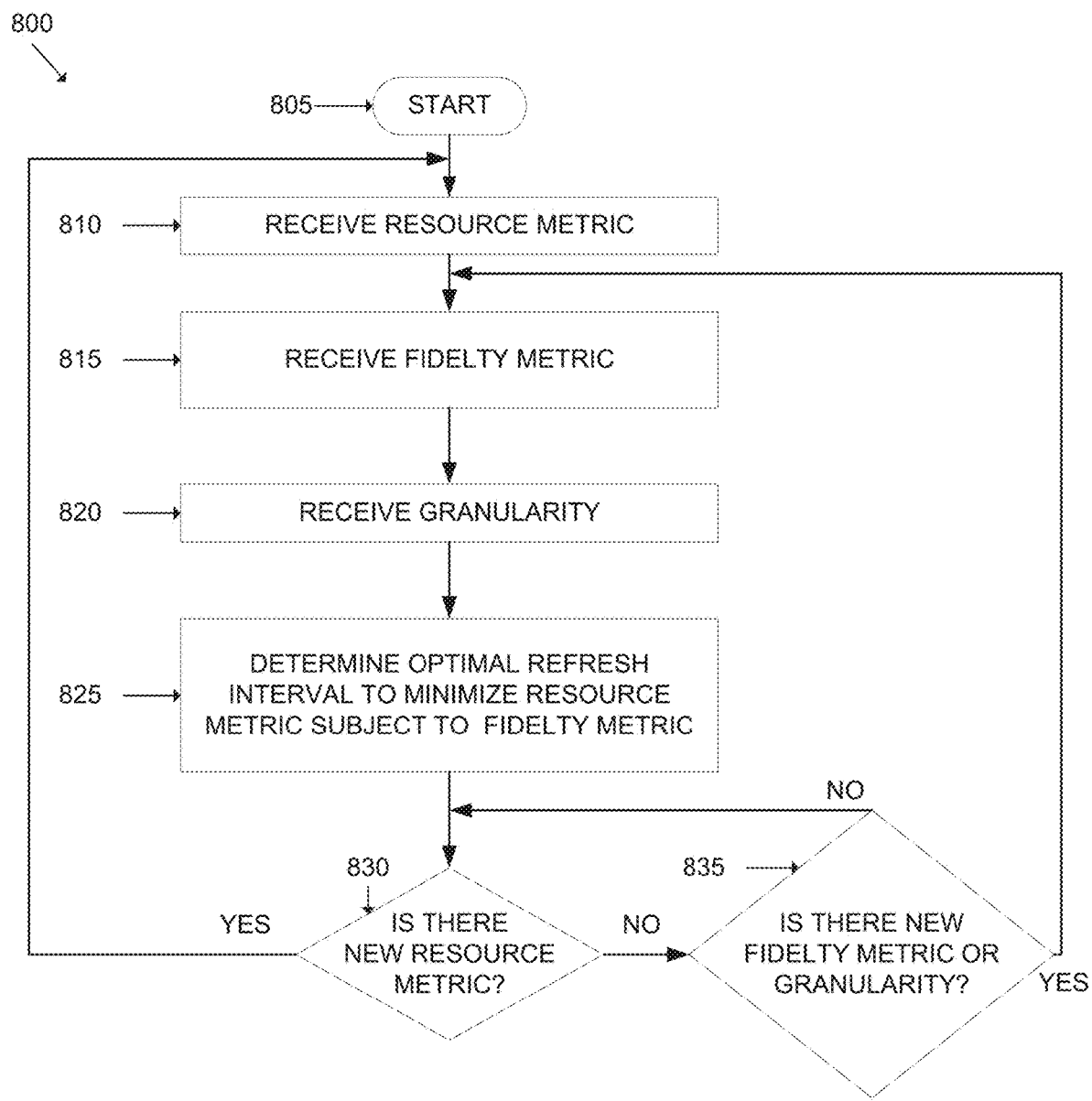
FIG. 8 is another example flowchart outlining certain operations of the flowchart of FIG. 6 in greater detail, in accordance with some embodiments of the present disclosure.

Turning now to FIG. 8, another example flowchart outlining a process 800 is shown, in accordance with some embodiments of the present disclosure. The process 800 may include additional or other operations depending upon the particular embodiment. The process 800 may be implemented by the refresh systems 400, 500, 505. The description below is with respect to the refresh system 400. However, the process 800 is also applicable to the refresh systems 500 and 505. The process 800 may be used to compute an optimal refresh interval for a bit position of a B-bit word. Specifically, the process 800 may be used to compute optimal refresh intervals that minimize a resource metric while achieving a given fidelity metric constraint. The process 800 starts with storing a new B-bit word within the DRAM module 420. The process 800 may also be implemented for words that were previously stored within the DRAM module 420.

Thus, upon starting at an operation 805, the refresh interval control system 405 receives a resource metric (e.g., refresh power) at operation 810. The operation 810 is similar to the operation 715. At operation 815, the refresh interval control system 405 receives a fidelity metric (e.g., MSE). The operation 815 is similar to the operation 710. Further, at operation 820, the refresh interval control system 405 receives a granularity. The operation 8120 is similar to the operation 720. Upon receiving the fidelity metric, the resource metric, and the granularity, the refresh interval control system 405 determines the optimal refresh interval for each bit position of the B-bit word, as discussed above.

Specifically, the refresh interval control system 405 determines the optimal refresh interval for each bit position to minimize the resource metric received at the operation 810 while achieving the fidelity metric received at the operation 815. The refresh interval control system 405 also applies equality conditions to the refresh interval, as discussed above, to achieve the granularity received at the operation 820. In some embodiments, the refresh interval control system 405 may use a look-up table for determining the optimal refresh interval for each bit position, as discussed above with respect to the operation 725.

Thus, the refresh interval control system 405 may use one or more of the fidelity metric, resource metric, or granularity as input to output B values of the optimal refresh interval, such that each of the B values corresponds to the optimal refresh interval for one bit position of the B-word. Further, the refresh interval control system 405 may compute the optimal refresh intervals such that the optimal refresh interval for more important bit positions is less than the optimal refresh interval for less important bit positions. In some embodiments, the MSB may be more important than LSB, and therefore, may have a shorter refresh interval than the LSB. In some embodiments, the refresh interval may increase from the MSB to the LSB subject to the granularity. The refresh interval control system 405 or another designated component performs refresh operations on the sub-arrays 415A-415N in which the various bits of the B-word are stored. The sub-array (e.g., the sub-array 415N) in which the MSB is stored may have the shortest refresh interval and the sub-array 415A in which the LSB is stored may have the longest refresh interval for the bit positions of the B-bit word.

The refresh interval control system 405 or the another designated component continues to perform refresh operations using the optimal refresh intervals of the operation 825 until a new resource metric is received at operation 830. Thus, at the operation 830, the refresh interval control system 405 may determine if a new resource metric is received. The refresh interval control system 405 may check for a new resource metric periodically or upon satisfying predetermined conditions. The new resource metric of the operation 730 may be a different resource metric than the one received previously at the operation 810 or a different value of the same metric received at the operation 810. If a new resource metric is received at the operation 830, the process 800 loops back to the operation 810 and repeats the operations 810-825. If no new resource metric is received at the operation 830, in some embodiments, the refresh interval control system 405 may determine if a new fidelity metric or granularity is received at operation 835. If no new fidelity metric and no new granularity is received at the operation 835, the refresh interval control system 405 goes back to the operation 830 and continues to monitor for updates to the resource metric. If a new fidelity metric is received at the operation 835, the process 800 loops back to the operation 815, as shown in FIG. 8, and repeats the operation 815-825 using the resource metric that was previously received at the operation 810. If a new granularity is received at the operation 835, the process 800 loops back to the operation 820 (not shown in FIG. 7) and repeats the operation 825 using the resource metric previously received at the operation 810 and the fidelity metric previously received at the operation 815.

Figure 9:
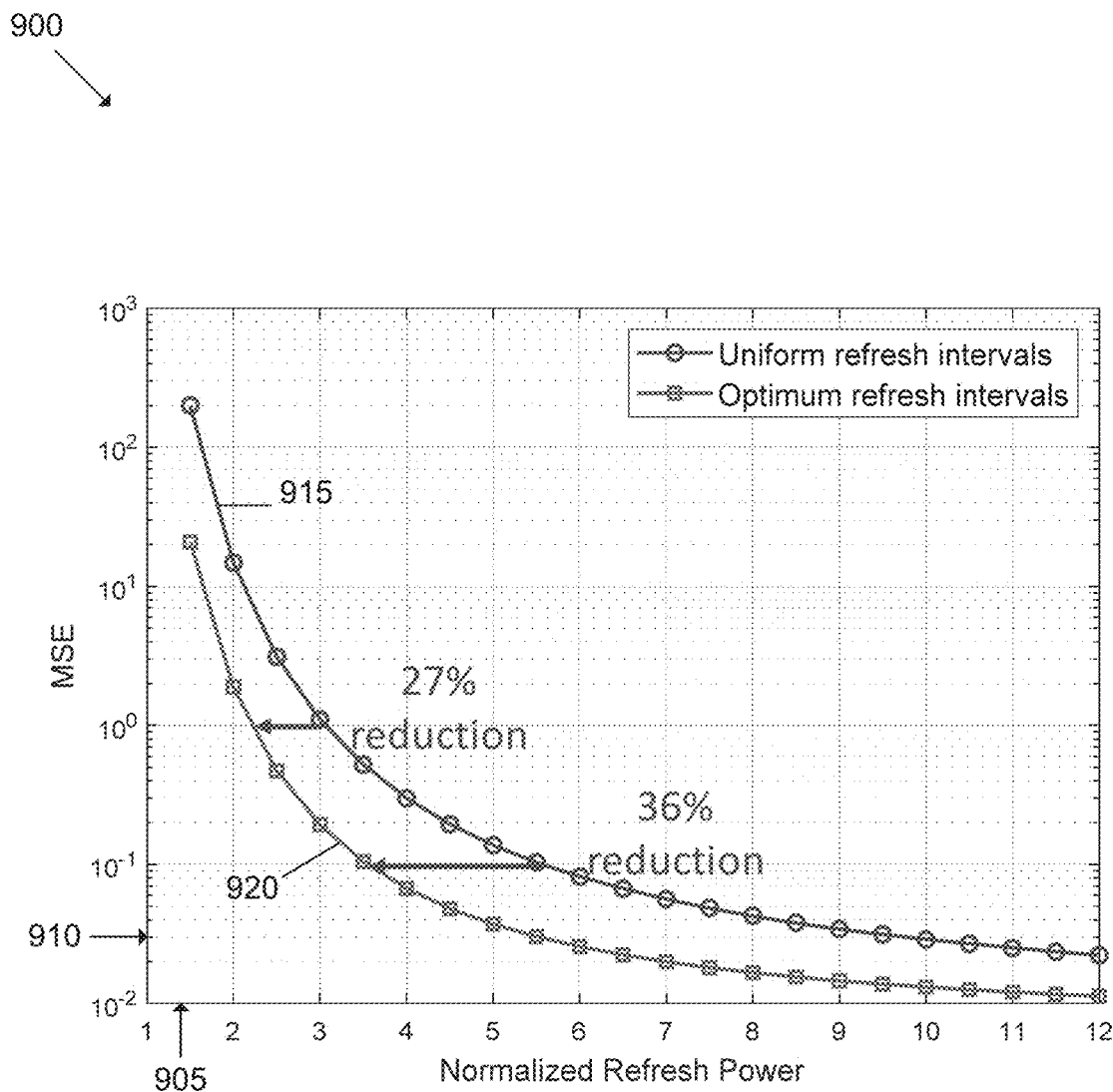
FIG. 9 is an example graph plotting the relationship between a fidelity metric and a refresh power consumption for a particular bit position of data stored in the DRAM memory chip of FIG. 2, in accordance with some embodiments of the present disclosure.

Referring to FIG. 9, an example graph 900 comparing MSE and normalized refresh power is shown, in accordance with some embodiments of the present disclosure. A lower MSE and lower refresh power consumption are desirable.

The graph 900 plots normalized refresh power on X-axis 905 against MSE on Y-axis 910. The graph 900 also includes a first curve 915 that corresponds to refresh intervals for a particular bit position obtained using conventional mechanisms and a second curve 920 that corresponds to optimal refresh intervals for the particular bit position obtained using the present disclosure. The second curve 920 that computes the optimal refresh interval for the particular bit position has a lower MSE and consumes lesser refresh power compared to the refresh intervals computed for that same bit position using conventional mechanisms. For example, at an MSE of one, the optimally computed refresh interval reduces refresh power consumption by twenty seven percent. Similarly, at an MSE of one tenth, the optimally computed refresh interval achieves an even greater saving in refresh power consumption of about thirty six percent. Although not shown, it is also seen from the graph 900 that at a given refresh power, the second curve 920 has a lower MSE than the first curve 915.

Thus, the optimally computed refresh intervals of the present disclosure reduce errors in the bit positions, while conserving refresh power.

Figure 10:
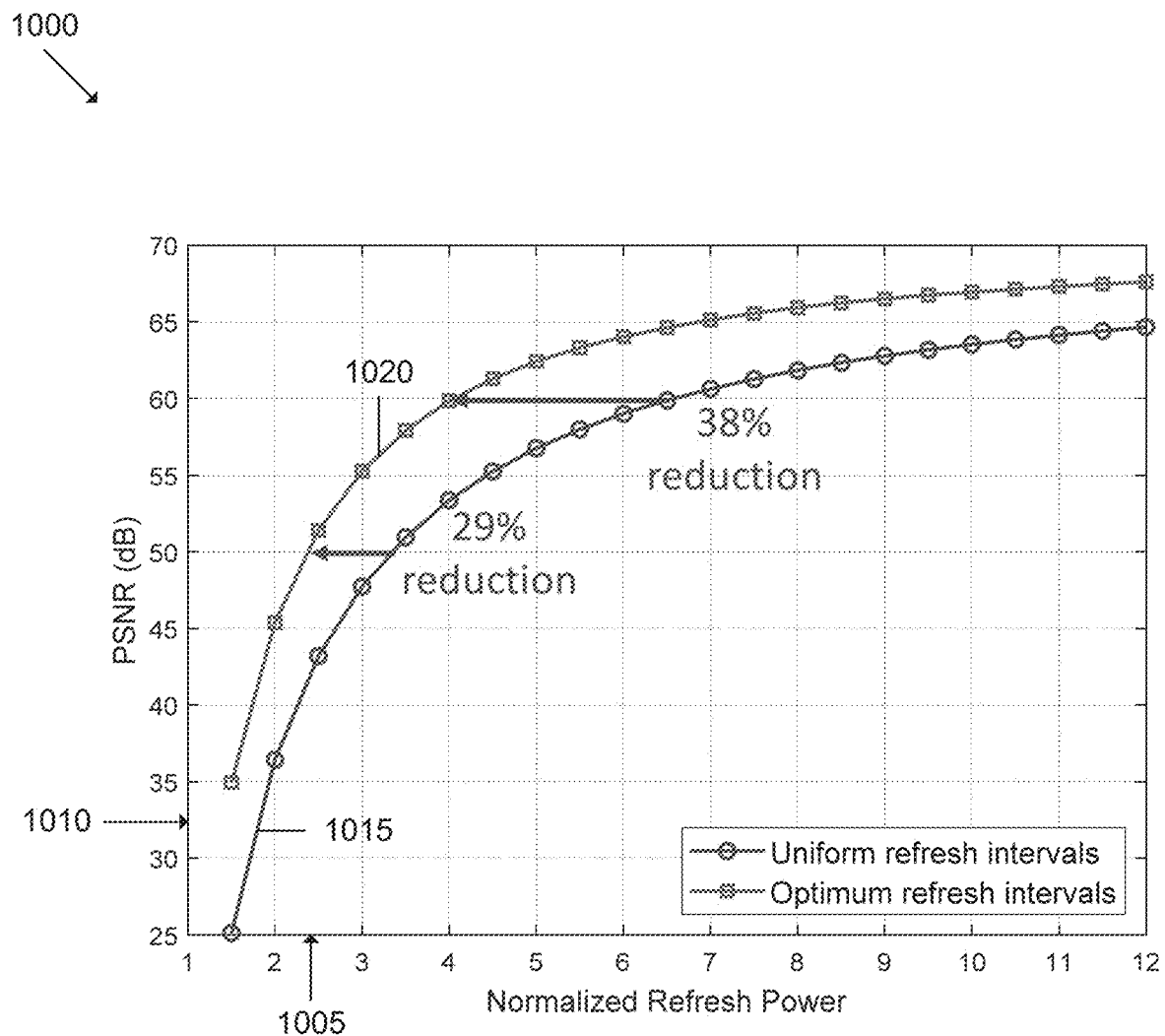
FIG. 10 is an example graph plotting the relationship between another fidelity metric and a refresh power consumption for a particular bit position of data stored in the DRAM memory chip of FIG. 2, in accordance with some embodiments of the present disclosure.

Turning to FIG. 10, an example graph 1000 comparing PSNR and normalized refresh power is shown, in accordance with some embodiments of the present disclosure. A higher PSNR and lower refresh power consumption are desirable. The graph 1000 plots normalized refresh power on X-axis 1005 against PSNR on Y-axis 1010. The graph 1000 also includes a first curve 1015 that corresponds to refresh intervals for a particular bit position obtained using conventional mechanisms and a second curve 1020 that corresponds to optimal refresh intervals for the particular bit position obtained using the present disclosure. The second curve 1020 that computes the optimal refresh intervals for the particular bit position has a higher PSNR and consumes lesser refresh power compared to the refresh intervals computed for that same bit position using conventional mechanisms. For example, at a PSNR of fifty decibels, the optimally computed refresh interval reduces refresh power consumption by about twenty nine percent. Similarly, at a PSNR of sixty decibels, the optimally computed refresh interval achieves an even greater saving in refresh power consumption of about thirty eight percent. Although not shown, it is also seen from the graph 1000 that at a given refresh power, the second curve 1020 has a higher PSNR than the first curve 1015.

Figure 11:
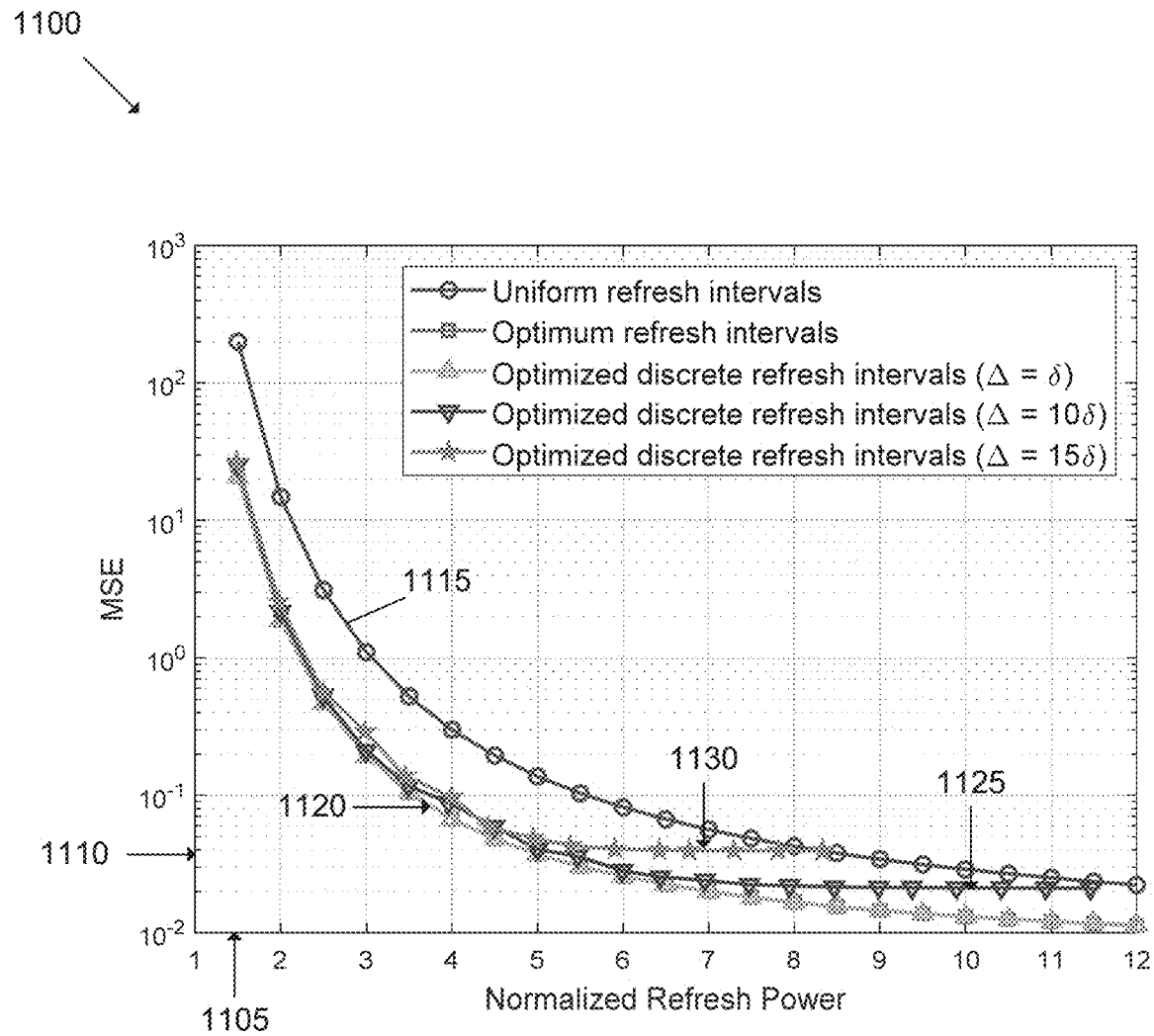
FIG. 11 is another example graph plotting the relationship between a fidelity metric and a refresh power consumption for a particular bit position of data stored in the DRAM memory chip of FIG. 2, in accordance with some embodiments of the present disclosure.

Referring to FIG. 11, an example graph 1100 comparing MSE and normalized refresh power is shown, in accordance with some embodiments of the present disclosure. A lower MSE and lower refresh power consumption are desirable. The graph 1100 plots normalized refresh power on X-axis 1105 against MSE on Y-axis 1110. The graph 1100 also includes a first curve 1115 that corresponds to refresh intervals for a particular bit position obtained using conventional mechanisms and a second curve 1120 that corresponds to optimal refresh intervals for the particular bit position obtained using the present disclosure in which the optimal refresh interval is equal to the value of the parameter, δ (e.g., sixty four milliseconds). The graph 1100 also shows a third curve 1125 in which the optimal refresh intervals for the bit position are ten times the value of the parameter, δ, while a fourth curve 1130 shows that optimal refresh intervals for the bit position are fifteen times the value of the parameter, δ. The second curve 1120, the third curve 1125, and the fourth curve 1130 each have lower MSE for a given refresh power and a lower refresh power for a given MSE. Further, the third curve 1125 and the fourth curve 1130 are very similar to the first curve 1115 and that the MSE and refresh power penalty for using discrete refresh intervals (e.g., in the third curve 1125 and the fourth curve 1130) is minimal compared to that of the first curve 1115.

Figure 12:
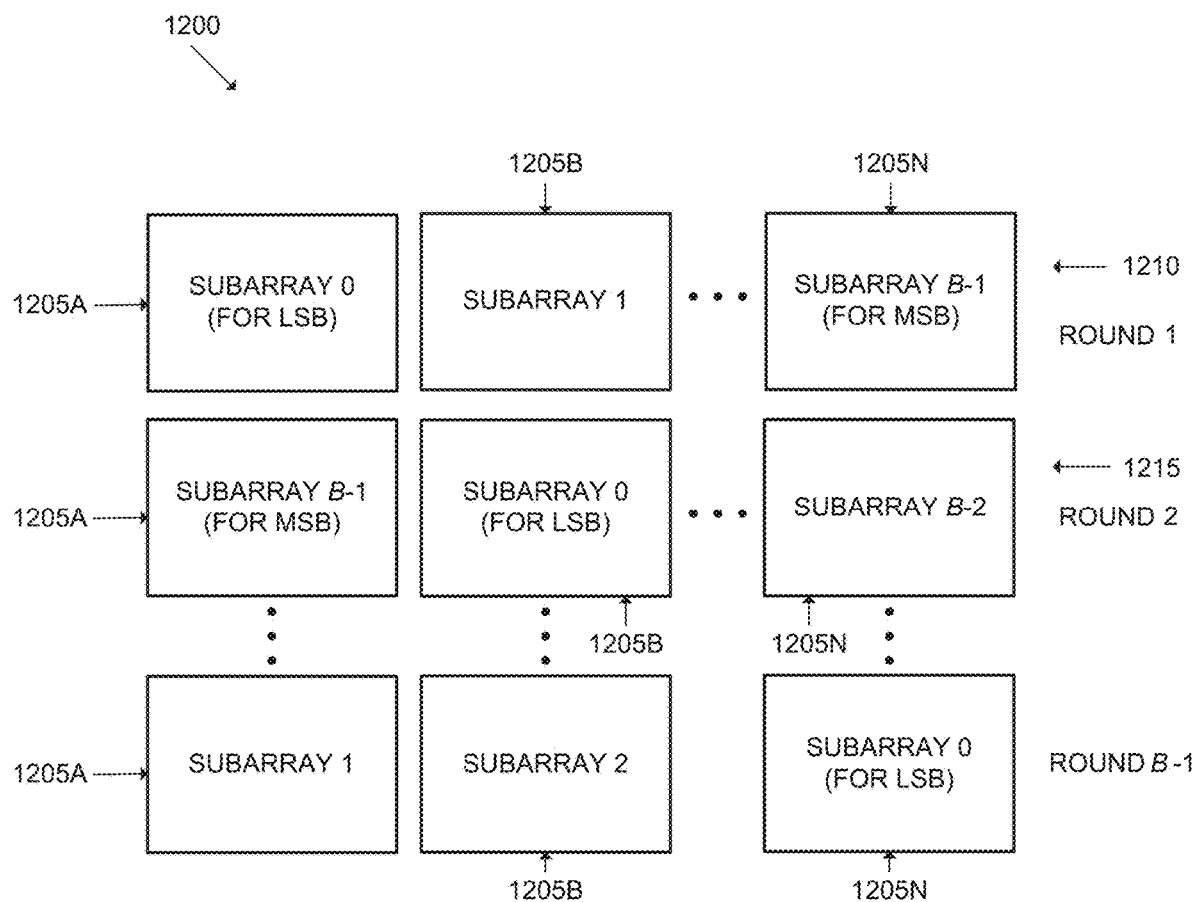
FIG. 12 is an example block diagram of a scrambling operation, in accordance with some embodiments of the present disclosure.

Turning now to FIG. 12, an example block diagram showing a wear-leveling operation 1200 is shown, in accordance with some embodiments of the present disclosure. As discussed above, each bit of a B-bit word is stored in a different sub-array of a DRAM module. As also discussed above, the sub-arrays that store bits with more important bit positions (e.g., MSB) are refreshed more frequently than the sub-arrays that store bits with less important bit positions (e.g., LSB). The sub-arrays that are not refreshed frequently or are refreshed at refresh intervals below a threshold may suffer from bit drift in which the bit value stored within the less frequently refreshed sub-array may drift to a bias value. Further, more frequently refreshed sub-arrays may suffer greater wear than less frequently refreshed sub-arrays. To somewhat equalize wear on the sub-arrays, in some embodiments, the interleaver (e.g., the interleaver 410) may apply the wear-leveling operation 1200.

In the wear-leveling operation 1200, the bit positions that are stored in sub-arrays 1205A-1205N may be rotated such that each sub-array goes through periods of frequent refreshing (e.g., when storing MSB) and less frequent refreshing (e.g., when storing LSB). Specifically, as shown in FIG. 12, in a first round 1210, the sub-array 1205A may store the LSB and the sub-array 1205N may store the MSB. Thus, during the first round 1210, the sub-array 1205N is more frequently refreshed than the sub-array 1205A. In a second round 1215, the bit positions may be shifted by one step such that the sub-array 1205A now stores the MSB and the sub-array 1205B now stores the LSB, and so on. Thus, during the second round 1215, the sub-array 1205A is more frequently refreshed than the sub-array 1205B and the sub-array 1205N. Although the shifting is shown to be one step to the right, in other embodiments, the shifting may be one step to the left or may shift multiple steps.

Thus, by performing the wear-leveling operation 1200, the wear on the sub-arrays 1205A-1205N may be equalized. The switching from the first round 1210 to the second round 1210 may occur when certain pre-determined conditions are satisfied. For example, in some embodiments, the switching of the rounds may occur after a designated number of refresh operations have been performed. In other embodiments, the switching may occur after a pre-determined time period has passed, a number of words have been stored, etc.

Further, the occurrence of retention failures is higher when a memory cell stores bit "1" rather than "0." If the original data is composed of only 1s, then that data may suffer from higher retention failure rates. Thus, a scrambler (or randomizer) may be used to equalize the retention failure rates for any kinds of data by equalizing the number of "1" and "0" in the original data. In some embodiments, in addition to or instead of scrambling, the memory cells that store 1s may be refreshed at a higher rate than the memory cells that store 0s to reduce the retention failure of the memory cells that store 1s. In such cases, an optimal refresh interval may be computed for the memory cells based upon the relative importance of the bit position, as discussed above, as well as based upon the value of the data (1 or 0) that is stored within a particular memory cell.

Therefore, the present disclosure provides for computing non-uniform optimal refresh intervals for each bit position. The charge on each capacitor of a DRAM memory cell may be periodically and non-uniformly refreshed based on the computed optimal refresh intervals. Shorter refresh intervals may decrease the bit error rate (BER) of the memory device. A different refresh interval may be allocated to different sub-arrays based on the relative importance of the bit positions. The optimal refresh intervals may be identified dynamically, such as in real-time or substantially in real-time.

Although the present disclosure may focus on optimizing refresh operations of DRAM memory, the systems and methods disclosed herein can be applicable to any memory that utilizes refresh operations. Further, in some embodiments, and particularly for memories that store more than one bit of information per cell (e.g., are configured as multi-level cells), gray mapping may be used along with the optimal refresh intervals discussed herein. Depending on the embodiment, certain acts, events, or functions of any of the processes or algorithms described herein can be performed in a different sequence, can be added, merged, or left out altogether (e.g., not all described operations or events are necessary for the practice of the algorithm). Moreover, in certain embodiments, operations or events can be performed concurrently, e.g., through multi-threaded processing, interrupt processing, or multiple processors or processor cores or on other parallel architectures, rather than sequentially.

The various illustrative logical blocks, modules, routines, and algorithm steps described in connection with the embodiments disclosed herein can be implemented as electronic hardware, or combinations of electronic hardware and computer software. To clearly illustrate this interchangeability, various illustrative components, blocks, modules, and steps have been described above generally in terms of their functionality. Whether such functionality is implemented as hardware, or as software that runs on hardware, depends upon the particular application and design constraints imposed on the overall system. The described functionality can be implemented in varying ways for each particular application, but such implementation decisions should not be interpreted as causing a departure from the scope of the disclosure.

Moreover, the various illustrative logical blocks and modules described in connection with the embodiments disclosed herein can be implemented or performed by a machine, such as a general purpose processor device, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A control processor can synthesize a model for an FPGA. For example, the control processor can synthesize a model for logical programmable gates to implement a tensor array and/or a pixel array. The control channel can synthesize a model to connect the tensor array and/or pixel array on an FPGA, a reconfigurable chip and/or die, and/or the like. A general purpose processor device can be a microprocessor, but in the alternative, the processor device can be a controller, microcontroller, or state machine, combinations of the same, or the like. A processor device can include electrical circuitry configured to process computer-executable instructions. In another embodiment, a processor device includes an FPGA or other programmable device that performs logic operations without processing computer-executable instructions. A processor device can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor device may also include primarily analog components. For example, some or all of the algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

The elements of a method, process, routine, or algorithm described in connection with the embodiments disclosed herein can be embodied directly in hardware, in a software module executed by a processor device, or in a combination of the two. A software module can reside in RAM memory, flash memory, ROM memory, EPROM memory, EEPROM memory, registers, hard disk, a removable disk, a CD-ROM, or any other form of a non-transitory computer-readable storage medium. An exemplary storage medium can be coupled to the processor device such that the processor device can read information from, and write information to, the storage medium. In the alternative, the storage medium can be integral to the processor device. The processor device and the storage medium can reside in an ASIC. The ASIC can reside in a user terminal. In the alternative, the processor device and the storage medium can reside as discrete components in a user terminal.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without other input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

While the above detailed description has shown, described, and pointed out novel features as applied to various embodiments, it can be understood that various omissions, substitutions, and changes in the form and details of the devices or algorithms illustrated can be made without departing from the spirit of the disclosure. As can be recognized, certain embodiments described herein can be embodied within a form that does not provide all of the features and benefits set forth herein, as some features can be used or practiced separately from others.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances, where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A method comprising:
    storing each bit of a B-bit word in a different sub-array of a memory device, wherein each of the bits is associated with a bit position in the B-bit word and each of the bits is stored in a respective sub-array according to its respective bit position with the most significant bit in a first sub-array and the least significant bit in a second sub-array, and wherein the memory device comprises a plurality of sub-arrays;
    determining a refresh interval for a plurality of the bit positions including a first refresh interval for the most significant bit and a second refresh interval for the least significant bit based upon a relative importance of the plurality of the bit positions to a performance of a machine learning or signal processing task involving the B-bit word, wherein the refresh interval is based upon a fidelity metric and a resource metric, the first refresh interval is shorter than the second refresh interval;
    refreshing the plurality of sub-arrays based upon the refresh interval determined for the plurality of bit positions, wherein refreshing an individual sub-array of the plurality of sub-arrays includes reading data from memory cells of the individual sub-array and writing the data back to the memory cells; and
    dynamically updating the refresh interval for the plurality of bit positions upon receiving a new fidelity metric or a new resource metric.

2. The method of claim 1, wherein the refresh interval is optimized to minimize the fidelity metric while satisfying the resource metric.

3. The method of claim 1, wherein the refresh interval is optimized to minimize the resource metric while satisfying the fidelity metric.

4. The method of claim 1, wherein the refresh interval is optimized to satisfy a granularity.

5. The method of claim 1, further comprising identifying the relative importance of the plurality of bit positions before determining the refresh interval.

6. The method of claim 1, wherein a most significant bit of the B-bit word is more important than a least significant bit of the B-bit word.

7. The method of claim 1, wherein the refresh interval of the most significant bit and the refresh interval of the least significant bit are multiples of a value of a refresh interval parameter.

8. The method of claim 1, wherein the bit position that is of greater relative importance is assigned a shorter refresh interval than the bit position that is of lesser relative importance.

9. The method of claim 1, wherein the memory device comprises a dynamic random access memory device.

10. The method of claim 1, wherein the fidelity metric comprises at least one of mean square error or peak signal-to-noise ratio.

11. The method of claim 1, wherein the resource metric comprises refresh power consumption.

12. The method of claim 1, wherein dynamically updating of the refresh interval occurs in real-time or substantial real-time.

13. The method of claim 1, wherein determining the refresh interval comprises inputting the fidelity metric or the resource metric into a look-up table, and receiving the refresh interval as an output from the look-up table.

14. A system comprising:
a memory controller configured to connect with each of a plurality of sub-arrays of a memory device, wherein the memory controller comprises programmed instructions to:
receive a plurality of B-bit words from a machine learning or signal processing application;
store one bit of each B-bit word in each of the plurality of sub-arrays such that a most significant bit of each B-bit word is stored in a first sub-array and a least significant bit of each B-bit word is stored in a second sub-array;
determine a first refresh interval for the most significant bit of the plurality of B-bit words and a second refresh interval for the least significant bit of the plurality of B-bit words, wherein the first refresh interval is less than the second refresh interval, and wherein the first refresh interval and the second refresh interval are determined to either minimize a fidelity metric or minimize a resource metric; and
refresh the first sub-array of the plurality of sub-arrays storing the most significant bit based on the first refresh interval and refresh the second sub-array of the plurality of sub-arrays storing the least significant bit based on the second refresh interval.

15. The system of claim 14, wherein the memory device comprises a dynamic random access memory module comprising a plurality of dynamic random access memory chips, and wherein each of the plurality of dynamic random access memory chips comprises a plurality of banks.

16. The system of claim 15, wherein each of the plurality of sub-arrays comprises one of the plurality of banks of one of the plurality of dynamic random access memory chips.

17. The system of claim 15, wherein each of the plurality of sub-arrays comprises one of the plurality of dynamic random access memory chips.

18. The system of claim 14, wherein the memory controller further comprises programmed instructions to dynamically update the first refresh interval and the second refresh interval upon receiving a new fidelity metric or a new resource metric.

19. A non-transitory computer-readable medium comprising computer-readable instructions stored thereon that when executed by a processor associated with a dynamic random access memory module causes the processor to:
receive a fidelity metric;
receive a resource metric;
receive a granularity;
receive a plurality of B-bit words from a machine learning or signal processing application;
store the plurality of B-bit words in a plurality of sub-arrays such that a most significant bit of each B-bit word is stored in a first sub-array and a least significant bit of each B-bit word is stored in a second sub-array;
determine a refresh interval for a plurality of bit positions of the B-bit word to satisfy the granularity and the resource metric while minimizing the fidelity metric, wherein the refresh interval for a more important bit position to a performance of a machine learning or signal processing task involving the B-bit word is less than the refresh interval for a lesser important bit position; and
dynamically update the refresh interval of the plurality of bit positions upon receiving a new fidelity metric, a new resource metric, or a new granularity.

20. The non-transitory computer-readable medium of claim 19, wherein the more important bit position is the most significant bit, and wherein the lesser important bit position is the least significant bit.

21. The non-transitory computer-readable medium of claim 19, wherein the refresh interval is a multiple of a value of a refresh interval parameter.

* * * * *